United States Patent [19]

Morihara

[11] Patent Number: 5,495,439
[45] Date of Patent: Feb. 27, 1996

[54] SEMICONDUCTOR MEMORY DEVICE HAVING SOI STRUCTURE AND MANUFACTURING METHOD THEREOF

[75] Inventor: Toshinori Morihara, Hyogo, Japan

[73] Assignee: Mitsubishi Denki Kabushiki Kaisha, Tokyo, Japan

[21] Appl. No.: 301,755

[22] Filed: Sep. 7, 1994

[30] Foreign Application Priority Data

Sep. 27, 1993 [JP] Japan .................................. 5-239451
Jul. 8, 1994 [JP] Japan .................................. 6-157390

[51] Int. Cl.$^6$ .......................... G11C 11/24; H01L 27/02; H01L 29/78
[52] U.S. Cl. .......................... 365/149; 257/296; 257/310; 257/311; 257/350
[58] Field of Search .......................... 365/149, 145; 257/311, 310, 296, 68, 71, 350

[56] References Cited

U.S. PATENT DOCUMENTS

| | | | |
|---|---|---|---|
| 4,432,006 | 2/1984 | Takei . | |
| 4,839,707 | 6/1989 | Shields | 257/350 |
| 5,237,187 | 8/1993 | Suwanai | 257/296 |
| 5,406,102 | 4/1995 | Oashi | 257/296 |

FOREIGN PATENT DOCUMENTS

| | | |
|---|---|---|
| 0202515 | 11/1983 | European Pat. Off. . |
| 0207619 | 1/1987 | European Pat. Off. . |
| 60-250665 | 12/1985 | Japan . |
| 4-78166 | 3/1992 | Japan . |

OTHER PUBLICATIONS

"A Buried Capacitor DRAM Cell With Bonded SOI For 256M and 1GBIT DRAMs", Toshiyuki Nishihara et al., IEDM 92, 1992, pp. 803–806.

"Novel SOI CMOS Design Using Ultra Thin Near Intrinsic Substrate", S. D. S. Malhi et al., IEEE 1982, pp. 107–111.

A Dynamic RAM cell in Recrystallized Polysilicon, *IEEE Electron Device Letters*, vol. EDL–4, No. 1 (Jan. 1983).

Primary Examiner—David C. Nelms
Assistant Examiner—Son Mai
Attorney, Agent, or Firm—Lowe, Price, LeBlanc & Becker

[57] ABSTRACT

A dielectric layer is formed on a main surface of a semiconductor substrate. A silicon layer is formed on dielectric layer. MOS transistors are formed in the silicon layer and include impurity regions in a semiconductor layer. A capacitor is formed by cooperation of the impurity region, the dielectric layer, and the semiconductor substrate. The dielectric layer also serves as an insulating film of an SOI structure. Thus, a semiconductor memory device which achieves high performance and allows high integration can easily be obtained in a DRAM having an SOI structure.

7 Claims, 34 Drawing Sheets

SEMICONDUCTOR MEMORY DEVICE HAVING SOI STRUCTURE AND MANUFACTURING METHOD THEREOF

BACKGROUND OF THE INVENTION

1. Field of the Invention

The present invention relates to semiconductor memory devices, and particularly to devices having an SOI (Semiconductor On Insulator) structure and a method of manufacturing the same.

2. Description of the Background Art

Conventionally, a DRAM (Dynamic Random Access Memory) is well known in the art as a semiconductor memory device capable of random input/output of memory information. In general, the DRAM includes a memory cell array portion serving as a memory region for storing a large amount of information and a peripheral circuit portion for controlling an operation of the memory cell array portion.

FIG. 50 is a block diagram showing a structure of an ordinary DRAM. With reference to FIG. 50, a DRAM 150 includes: a memory cell array 151 for storing data signals of memory information; a row and column address buffer 152 which receives externally an address signal for selecting a memory cell constituting a unit memory information; a row decoder 153 and a column decoder 154 for specifying a memory cell by decoding the address signal; a sense refresh amplifier 155 for amplifying and reading a signal stored in the specified memory cell; a data in buffer 156 and a data out buffer 157 for data input/output; and a clock generator 158 for generating a clock signal.

In memory cell array 151 which occupies a large area on a semiconductor chip, a plurality of memory cells for storing unit memory information are arranged in a matrix. Generally, one memory cell is formed by a MOS (Metal Oxide Semiconductor) transistor and a capacitor connected thereto. Such a memory cell is called a one-transistor one-capacitor type memory cell. Since this type of memory cell has a simple structure, integration of a memory cell can be improved easily. Therefore, such a memory cell has been widely used in a DRAM having a large capacitance.

Memory cells in the DRAM can be divided into several types depending on a structure of a capacitor. One type is called a stacked type capacitor. In the stacked type capacitor, a major portion of a capacitor is extended onto as far as a gate electrode and a field oxide film so as to increase an opposing area between electrodes of the capacitor.

Accordingly, capacitance of the capacitor can be increased. Having this characteristic, the stacked type capacitor can secure the capacitance of the capacitor even if elements are miniaturized in accordance with high integration of a semiconductor memory device. As a result, such a stacked type capacitor has become widely used as integration of semiconductor memory devices is further developed However, if elements are further miniaturized in the future, it is likely that securing a certain capacitance of the capacitor will be no longer possible even though the previously described stacked type capacitor is used. Therefore, in order to secure the certain capacitance of the capacitor and to improve a characteristic of a transfer gate transistor used in the DRAM regardless of further miniaturization of elements and high integration of memory cells, a technique using an SOI structure in the DRAM has been disclosed in Japanese Patent Laying-Open No. 60-250665.

FIG. 51 is a partial sectional view showing a DRAM disclosed in Japanese Patent Laying-Open No. 60-250665. An example of a conventional DRAM having an SOI structure will be described below with reference to FIG. 51.

As can be seen from FIG. 51, a thin insulating oxide film 102 and a thick oxide film 103 are formed on a main surface of p type silicon substrate 101. A conductive layer 104 formed of polycrystalline silicon is formed on thin insulating oxide film 102. A capacitor 120 is formed by silicon substrate 101, thin insulating oxide film 102 and conductive layer 104.

An insulating layer 105 having a contact hole at a predetermined position is formed on conductive layer 104. Within the contact hole is provided a plug 106 formed of a high melting point metal silicide or the like. A MOS transistor 107 is formed on insulating layer 105 and plug 106. MOS transistor 107 include impurity regions 121 and 122 serving as source/drain regions formed in a silicon layer and a gate electrode 109.

Impurity region 12 is connected electrically to conductive layer 104 via plug 106. Also, impurity region 122 is connected electrically to a bit line 108. Insulating layers 133 and 134 are formed to cover MOS transistor 107. On insulating layer 133 is provided a word line 110 connected electrically to gate electrode 109.

In such a DRAM having an SOI structure, MOS transistor 107 is formed on capacitor 120 with insulating layer 105 interposed therebetween, whereby a large planar area of capacitor 120 can be secured. This leads to securing of the certain capacitance of the capacitor even in high integration of elements. Also, MOS transistor 107 is provided with a characteristic specific to the SOI structure.

However, even in the DRAM having the SOI structure, there are three problems as will be described below. Now, the first problem will be described. In the DRAM having the SOI structure, a silicon layer in which MOS transistor 107 is formed and conductive layer 104 are formed in separate layers. Therefore, formations of, for example, plug 106 for electrically connecting impurity region 121 in the MOS transistor and conductive layer 104, and insulating layer 105 for isolating MOS transistor 107 from conductive layer 104 in a portion other than plug 106 are required. More particularly, formation of conductive layer 104, insulating layer 105, plug 106, the silicon layer in which the MOS transistor is formed, and the like, has to be formed respectively in separate steps. This results in the complex process and the high manufacturing cost.

Next, the second problem will be described. In the DRAM having the SOI structure, MOS transistor 107 is formed on capacitor 120 with insulating layer 105 interposed therebetween in order to increase the capacitance of the capacitor. This incurs the problem such as the increased height of the DRAM.

Next, the third problem will be described. As can be seen from FIG. 51, impurity region 121 in the DRAM is electrically connected to conductive layer 104 serving as a storage node electrode via plug 106. Accordingly, both a contact portion between impurity region 121 and plug 106 and a contact portion between plug 106 and conductive layer 104 are provided between impurity region 121 and conductive layer 104. Thus, a resistance value between impurity region 121 and conductive layer 104 is increased due to these two contact portions. This results in reduction of an operating speed of the DRAM.

SUMMARY OF THE INVENTION

The present invention is made to solve the above-described problems. One object of the present invention is to provide a semiconductor memory device having an SOI structure capable of simplifying a manufacturing process and a manufacturing method thereof.

Another object of the present invention is to provide a semiconductor memory device capable of reducing the height of the device and a manufacturing method thereof.

Still another object of the present invention is to provide a semiconductor memory device capable of improving an operating speed by reducing a resistance between one impurity region of a MOS transistor and a conductive layer serving as a storage node electrode, and a manufacturing method thereof.

It is assumed that a semiconductor memory device according to the present invention is a semiconductor memory device having an SOI structure. In one aspect of the present invention, a semiconductor memory device includes: a dielectric layer having opposing first and second surfaces; a semiconductor layer formed on a first surface of the dielectric layer; a conductive layer formed on a second surface of the dielectric layer; first and second impurity regions formed to define a channel region in a semiconductor layer; and a gate electrode formed on the channel region with an insulating layer interposed therebetween, wherein a capacitor is formed by the first impurity region, the dielectric layer opposite to the first impurity region, and the conductive layer.

Preferably, the dielectric layer is made of a high dielectric material. It is noted that the high dielectric material represents a material having a relative dielectric constant higher than that of a silicon oxide film. More preferably, the high dielectric material represents a material having a relative dielectric constant of 10 or more.

Preferably, the conductive layer is a semiconductor substrate. The semiconductor substrate is preferably formed of single crystalline silicon. Preferably, an impurity of a first conductivity type having a first concentration is introduced into the semiconductor substrate, wherein a third impurity region including an impurity of the first conductivity type having a second concentration higher than the first concentration is formed in a region located directly under the first impurity region in a surface of the semiconductor substrate contacting the dielectric layer. Preferably, the dielectric layer includes a first dielectric portion having a first relative dielectric constant and a second dielectric portion having a second relative dielectric constant smaller than the first relative dielectric constant, wherein the second impurity region is located on the second dielectric portion and the first impurity region is located on the first dielectric portion.

In the semiconductor memory device according to one aspect of the present invention, the first impurity region of a transfer gate transistor included in the semiconductor memory device also serves as one electrode of a capacitor, and the dielectric layer of the capacitor also serves as an insulating layer of the SOI structure. This eliminates the need for forming an insulating layer between one electrode of the capacitor and the semiconductor layer and forming a plug for electrically connecting one electrode of the capacitor to one impurity region in the semiconductor layer. As a result, the structure of the semiconductor memory device can be simplified and the height of the device can be reduced. Also, integrating one impurity region with one electrode of the capacitor, a contact resistance such as is included the conventional example between one electrode of the capacitor and one impurity region is eliminated. In other words, the parasitic resistance can be reduced. Thus, the operating speed of the semiconductor memory device can be improved.

If the conductive layer is formed by the semiconductor substrate, it is unnecessary to form the other electrode of the capacitor separately. This simplifies the manufacturing process. Also, if the third impurity region is formed, the capacitance of the capacitor can be further increased.

If the second dielectric portion having a relatively small relative dielectric constant is formed between the second impurity region and the conductive layer, the following effect can be obtained. More particularly, when an interconnection layer such as a bit line is connected to the second impurity region, the parasitic capacitance between the interconnection layer and the conductive layer can be suppressed smaller than that in the case of the above-described semiconductor memory device. Thus, the performance of the semiconductor memory device can be further improved. At this time, the capacitor is formed by the first impurity region, the first dielectric portion having a relatively high relative dielectric constant, and the conductive layer, whereby a certain capacitance of the capacitor can easily be secured.

According to another aspect of the present invention, it is assumed that a semiconductor memory device has an SOI structure including a memory cell array portion where memory cells are formed and a peripheral circuit portion where peripheral circuits are formed. The semiconductor memory device according to another aspect of the present invention includes: a dielectric layer having opposing first and second surfaces and extending from within the memory cell array portion into the peripheral circuit portion; a semiconductor layer formed on the first surface of the dielectric layer and extending from within the memory cell array portion into the peripheral circuit portion; a pair of first impurity regions formed spaced apart from each other so as to define a first channel region in the semiconductor layer located within the memory cell array portion; a first gate electrode formed on the first channel region with a first insulating layer interposed therebetween; a pair of second impurity regions formed spaced apart from each other so as to define a second channel region in the semiconductor layer within the peripheral circuit portion; a second gate electrode formed on the second channel region with a second insulating layer interposed therebetween; and a conductive layer formed on the second surface of the dielectric layer. The dielectric layer is formed by a first dielectric portion having a first relative dielectric constant in the memory cell array portion, and the dielectric layer is formed by a second dielectric portion having a second relative dielectric constant smaller than the first relative dielectric constant in the peripheral circuit portion.

In the semiconductor memory device according to another aspect of the present invention, the first dielectric portion having the relatively high relative dielectric constant is formed in the memory cell array portion, and the second dielectric portion having the relatively small relative dielectric constant is formed in the peripheral circuit portion. Thus, the certain capacitance of the capacitor can easily be secured in the memory cell portion, and the parasitic capacitance can be reduced in the peripheral circuit portion when compared with the case when the dielectric layer is formed throughout of a single material having the high relative dielectric constant.

According to still another aspect of the present invention, a semiconductor memory device includes: a first dielectric layer having opposing first and second surfaces; a semiconductor layer formed on the first surface of the dielectric layer; a first conductive layer formed on the second surface of the dielectric layer; first and second impurity regions formed to define a channel region in the semiconductor layer; a gate electrode formed on the channel region with an insulating layer interposed therebetween; a second dielectric layer formed on the first impurity region; and a second conductive layer formed on the second dielectric layer, wherein a first capacitor is formed by the first impurity region, the first dielectric layer opposite to the first impurity region, and the first conductive layer, and a second capacitor is formed by the first impurity region, the second dielectric layer opposite to the first impurity region, and the second conductive layer. Preferably, the second dielectric layer extends onto as far as the side surface of the first impurity region.

In the semiconductor memory device according to still another aspect of the present invention, the second capacitor is formed on the first capacitor. In other words, the second capacitor is newly added to the semiconductor memory device according to the above-described aspects. Thus, the capacitance of the capacitor can be increased further.

In a manufacturing method of a semiconductor memory device according to one aspect of the present invention, a dielectric layer is firstly formed on a main surface of a conductive substrate. A semiconductor layer is formed on the dielectric layer. A gate electrode is formed on the semiconductor layer with an insulating layer interposed therebetween. Using the gate electrode as a mask, impurities are introduced into the semiconductor layer, whereby a pair of impurity regions are formed in the semiconductor layer such that one impurity region is opposite to the conductive substrate with the dielectric layer interposed therebetween.

In the manufacturing method of the semiconductor memory device according to one aspect of the present invention, the first impurity region can be formed simultaneously with one electrode of the capacitor. Unlike the conventional example, formation of the contact portion between the first impurity region and one electrode of the capacitor as well as formation of the insulating layer between the semiconductor layer and one electrode of the capacitor are eliminated. Further, the insulating layer of the SOI structure can be formed simultaneously with the capacitor dielectric layer. This results in simplification of the manufacturing process of the semiconductor memory device.

In a manufacturing method of a semiconductor memory device according to another aspect of the present invention, a dielectric layer including a first dielectric portion having a first relative dielectric constant and a second dielectric portion having a second relative dielectric constant larger than the first relative dielectric constant is firstly formed on a main surface of a conductive substrate. Then, a semiconductor layer is formed on the dielectric layer. A gate electrode is formed on the semiconductor layer with an insulating layer interposed therebetween. Using the gate electrode as a mask, impurities are introduced into the semiconductor layer to form first and second impurity regions.

In the manufacturing method of the semiconductor memory device according to another aspect of the present invention, formation of the plug for connecting electrically the second conductive layer serving as one electrode of the capacitor with the second impurity region can be omitted. Also, it is unnecessary to form the insulating layer between the semiconductor layer and one electrode of the capacitor, unlike the conventional example. Thus, the manufacturing process can be made simpler than before.

In a manufacturing method of a semiconductor memory device according to still another aspect of the present invention, a semiconductor layer is firstly formed on a main surface of a conductive substrate. A gate electrode is formed on the semiconductor layer with an insulating layer interposed therebetween. Using the gate electrode as a mask, impurities are introduced into the semiconductor layer to form first and second impurity regions. An insulating layer is formed to cover the gate electrode and the semiconductor layer. Then, the conductive substrate is partially removed so as to expose a surface of the first impurity region. A dielectric layer formed of a high dielectric material is formed on the exposed surface of the first impurity region. A conductive layer is formed to oppose the first impurity region with the dielectric layer interposed therebetween.

In a manufacturing method of a semiconductor memory device according to still another aspect of the present invention, a semiconductor layer is firstly formed on a main surface of a first substrate. A gate electrode is formed on the semiconductor layer with an insulating layer interposed therebetween. Using the gate electrode as a mask, impurities are introduced into the semiconductor layer to form first and second impurity regions. An insulating layer is formed to cover the gate electrode and the semiconductor layer. A second substrate is joined onto a surface of the insulating layer. A surface of the first impurity region is exposed by removing the first substrate. On the exposed surface of the first impurity region is formed a dielectric layer formed of a high dielectric material. A conductive layer is formed to oppose the surface of the first impurity region with the dielectric layer interposed therebetween.

In the manufacturing method of a semiconductor memory device according to still another aspect of the present invention, the first and second impurity regions of a transfer gate transistor and the dielectric layer of the capacitor can be formed in the same step. Also, formation of the plug for connecting electrically the semiconductor layer with one electrode of the capacitor and formation of the insulating layer between the semiconductor layer and one electrode of the capacitor can be eliminated. Therefore, the manufacturing process can be made simpler than before. In the meanwhile, the dielectric layer is formed on the main surface of the substrate after formation of the semiconductor layer, the gate electrode, the first and second impurity regions, and the insulating layer, respectively. A characteristic of the dielectric layer is likely to be deteriorated when subjected to a high temperature processing at a temperature of 600° C. or more. Such a high temperature processing includes reflow for planarization of the insulating layer and diffusion of impurities for formation of the first and second impurity regions. In this case, however, the insulating layer and the first and second impurity regions are formed prior to the dielectric layer. Therefore, the dielectric layer is not subjected to such a high temperature processing. Consequently, deterioration of the characteristic of the dielectric layer can be prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described with reference to FIGS. 1–48.

Embodiment 1

Figure 1:
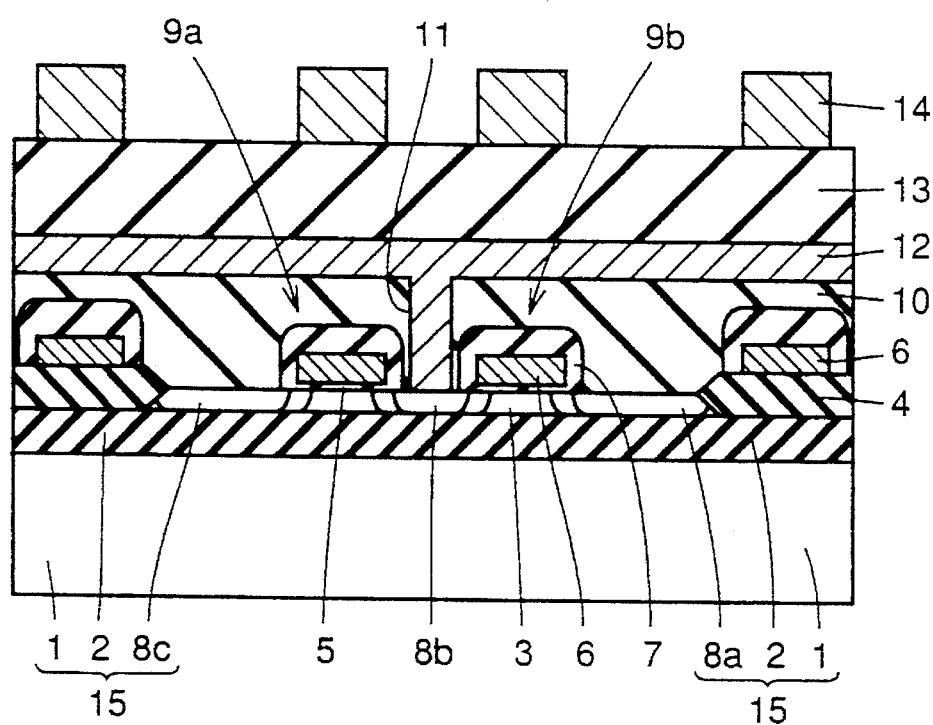
FIG. 1 is a sectional view showing a DRAM according to a first embodiment of the present invention.
Figure 2:
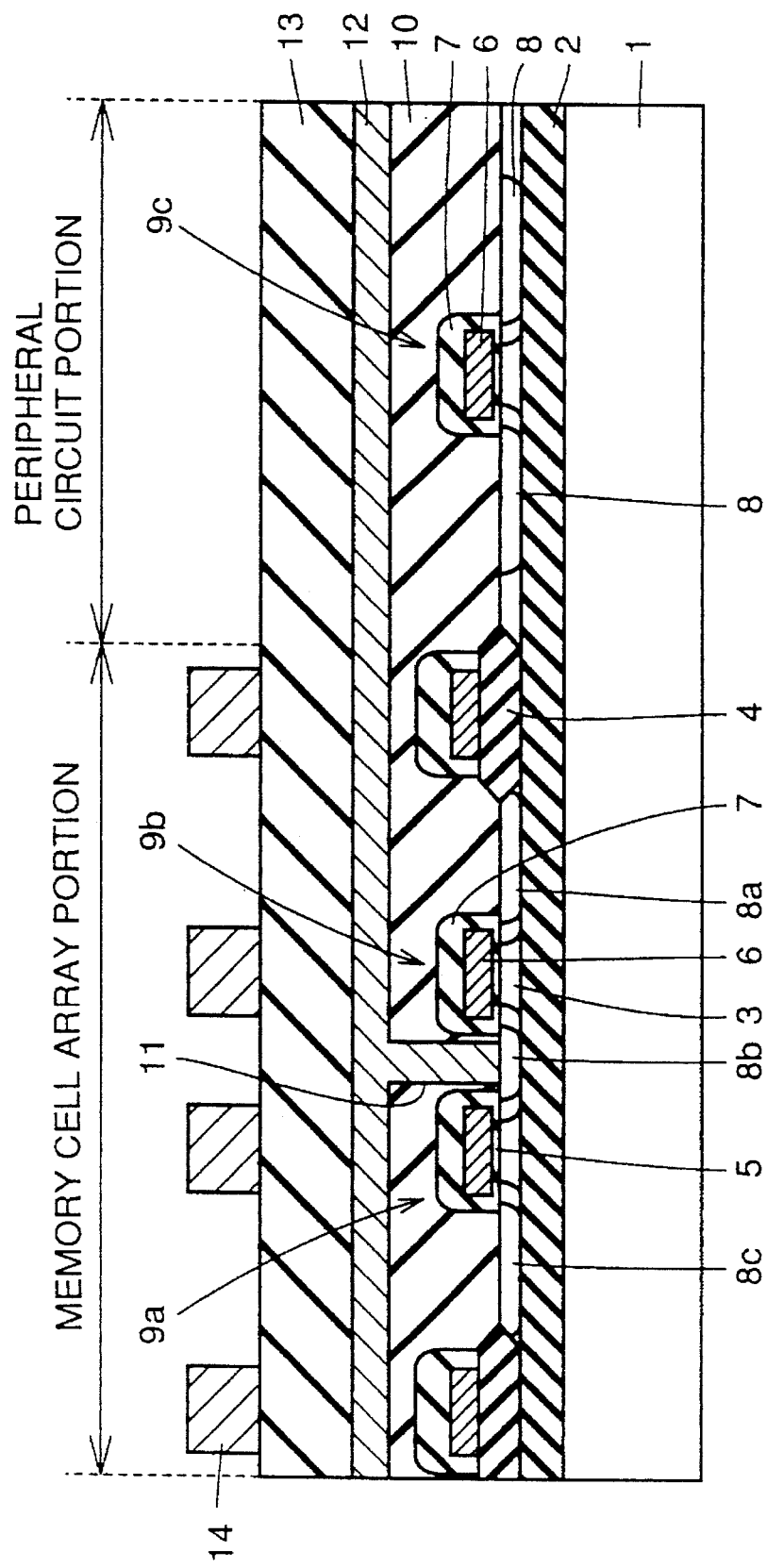
FIG. 2 is a sectional view showing a memory cell array portion and a peripheral circuit portion of the DRAM according the first embodiment of the present invention.
Figure 3:
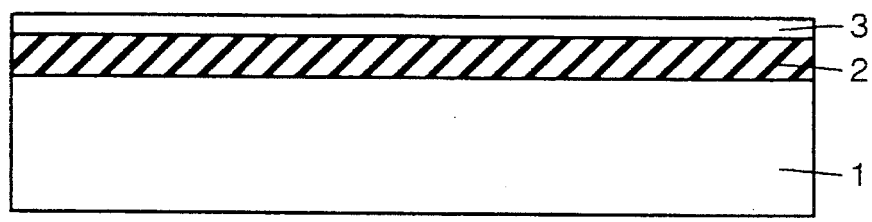
FIGS. 3–7 are partial sectional views showing first through fifth steps for manufacturing the DRAM according to the first embodiment of the present invention.

FIGS. 1 and 2 are partial sectional views showing a DRAM according to a first embodiment of the present invention. FIGS. 3–7 are partial sectional views showing first through fifth steps for manufacturing the DRAM according to the first embodiment.

With reference to FIGS. 1 and 2, a structure of the DRAM according to the first embodiment will be described. As can be seen from the figures, a dielectric layer 2 is formed on a main surface of a semiconductor substrate 1 having conductivity. Dielectric layer 2 is preferably formed by a silicon oxide film.

A silicon layer (or another semiconductor layer) 3 is formed on dielectric layer 2. A thickness of silicon layer 3 is preferably about 1000 Å–about 3000 Å. A field oxide film 4 is formed at a predetermined position of silicon layer 3. MOS transistors (transfer gate transistors) 9a and 9b located in a memory cell array portion and a MOS transistor 9c located in a peripheral circuit portion are formed in regions of silicon layer 3 surrounded by field oxide film 4.

MOS transistor 9a includes a pair of impurity regions 8b and 8c formed to define a channel region in silicon layer 3 and a gate electrode 6 formed on the channel region with a gate insulating film 5 interposed therebetween. Also, MOS transistor 9b includes a pair of impurity regions 8a and 8b and a gate electrode 6. MOS transistor 9c includes a pair of impurity regions 8, 8 and a gate electrode 6.

An insulating layer 7 is formed to cover gate electrode 6. A first interlayer insulating layer 10 formed of a BPSG film or the like is formed to cover insulating layer 7 and a surface of silicon layer 3. A contact hole 11 is formed at a predetermined position in first interlayer insulating layer 10. A bit line 12 is formed in contact hole 11 and on first interlayer insulating layer 10. Bit line 12 is connected electrically to one impurity region 8b of MOS transistors 9a and 9b. A second interlayer insulating layer 13 formed of a BPSG film or the like is formed on bit line 12. An interconnection layer 14 patterned into a predetermined shape is formed on second interlayer insulating layer 13.

In the DRAM having the above-described structure, a capacitor 15 is formed by semiconductor substrate 1, dielectric layer 2, and impurity region 8a or 8c. In other words, one impurity region 8a, 8c in MOS transistor 9a, 9b serves as one electrode (storage node electrode) of capacitor 15, and semiconductor substrate 1 serves as the other electrode (cell plate electrode) of capacitor 15.

Dielectric layer 2 serves as an insulating layer of the SOI structure, and at the same time serves as a dielectric layer of capacitor 15. With such a structure, the height of the device can be reduced.

Unlike the conventional example, it is unnecessary to electrically connect one impurity region 8a, 8c of MOS transistor 9a, 9b with the storage node electrode of the capacitor via the plug. More particularly, in this embodiment, there are no contact portions between the plug and impurity regions 8a and 8c and between the plug and the storage node electrode, which are required in the conventional example. Therefore, increase in a parasitic resistance caused by two contact portions can be prevented. This results in improvement of the operating speed of the DRAM.

With reference to FIGS. 3–7, a manufacturing process of the DRAM according to the first embodiment having the above-described structure will be described. As can be seen from FIG. 3, a dielectric layer 2 is formed by, for example, implanting oxygen ions of about $2 \times 10^{18}/cm^2$ into the main surface of a semiconductor substrate 1 and conducting a high temperature (1300° C.) processing, whereby the insulating layer of the SOI structure and the dielectric layer of the capacitor are formed simultaneously. Then, a silicon layer 3 in which a p type impurity, for example, is introduced is formed on dielectric layer 2 by CVD (Chemical Vapor Deposition) or the like.

Figure 4:
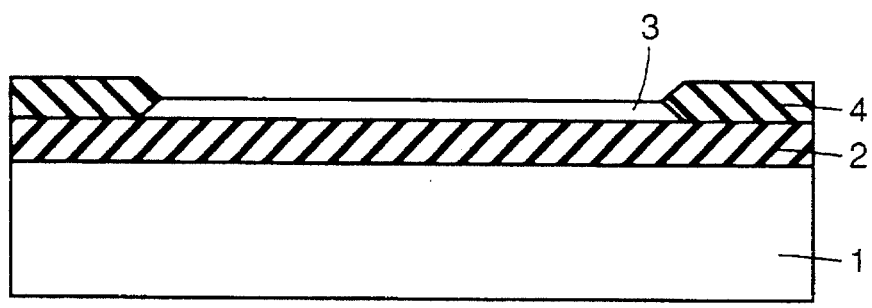

With reference to FIG. 4, a field oxide film 4 is formed in an element isolation region by LOCOS (Local Oxidation of Silicon) or the like.

Figure 5:
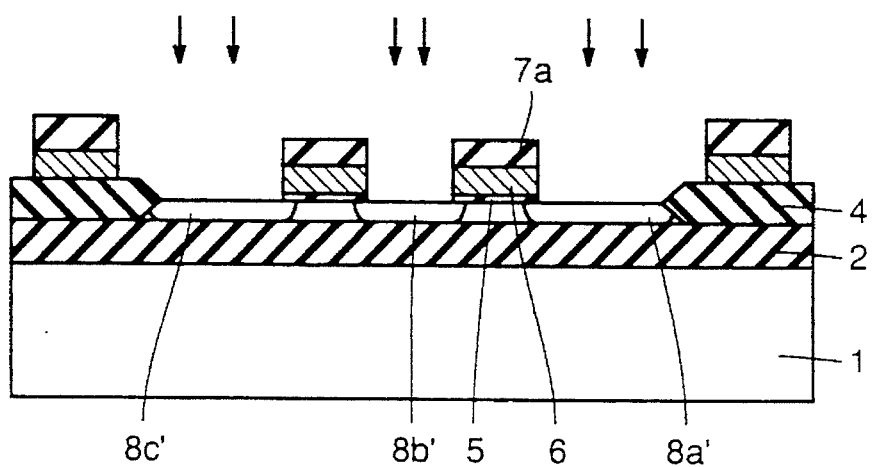

With reference to FIG. 5, a gate insulating layer 5 is formed on a surface of silicon layer 3 by thermal oxidation or the like. A polycrystalline silicon layer 6 is formed on gate insulating film 5 by CVD or the like. An insulating layer 7a is formed on polycrystalline silicon layer 6 by CVD or the like. Then, insulating layer 7a, polycrystalline silicon layer 6, and gate insulating film 5 are successively etched to form a gate electrode 6. Using gate electrode 6 and insulating layer 7a as a mask, an n type impurity is introduced into silicon layer 3, whereby impurity regions 8a', 8b', and 8c' are respectively formed. Polycrystalline silicon layer 6 may have a polycide structure.

Figure 6:
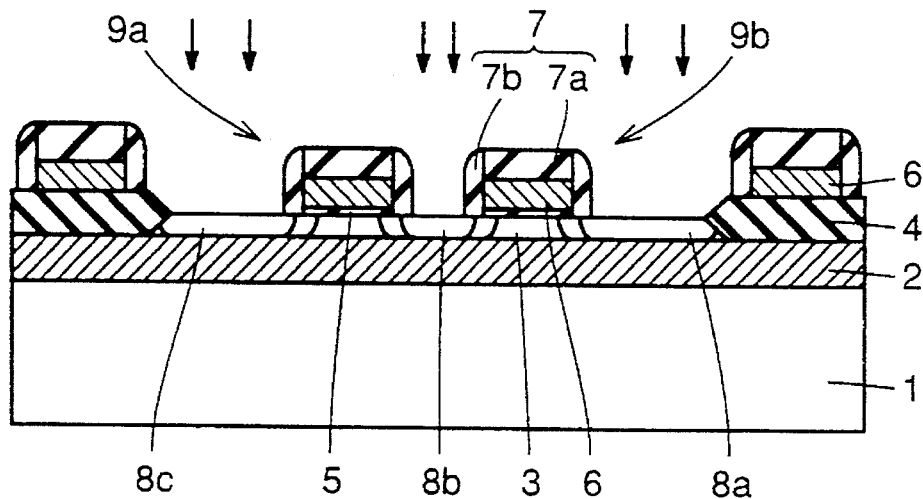

With reference to FIG. 6, an insulating layer is formed to cover insulating layer 7a and silicon layer 3 by CVD or the like. The insulating layer is subjected to anisotropic etching so as to form an insulating layer 7b on a sidewall of gate electrode 6. Using insulating layers 7a and 7b and gate electrode 6 as a mask, an n type impurity is introduced into silicon layer 3.

Accordingly, impurity regions 8a, 8b, and 8c serving as source/drain regions of MOS transistors 9a and 9b are respectively formed. At this time, an insulating layer 7 covering gate electrode 6 is formed by the above-described insulating layers 7a and 7b. It is understood that one electrode of the capacitor is simultaneously formed in this step, since impurity region 8a, 8c also serves as one electrode of the capacitors. At the same time as formation of MOS transistors 9a and 9b, MOS transistor 9c is formed in the peripheral circuit portion.

Figure 7:
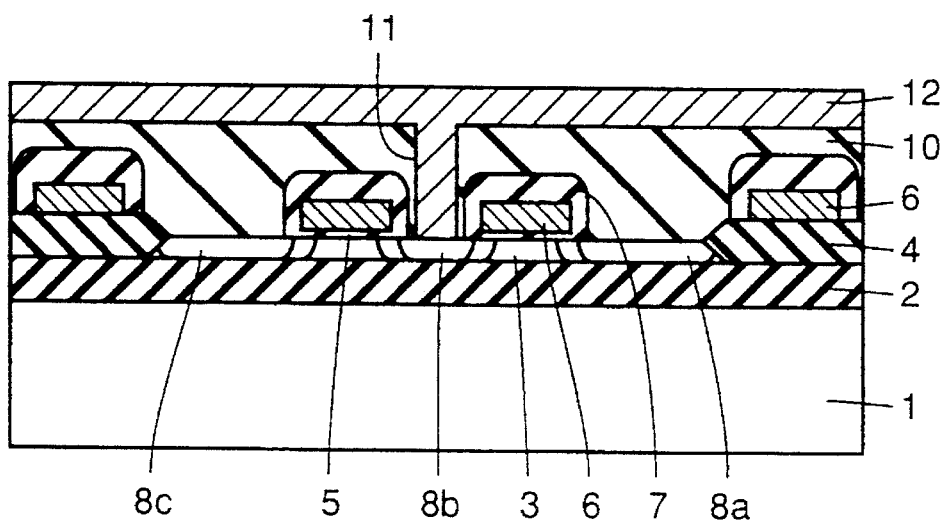

With reference to FIG. 7, a first interlayer insulating layer 10 made of a BPSG film or the like is deposited so as to cover insulating layer 7 and silicon layer 3 by CVD or the like. First interlayer insulating layer 10 is subjected to reflow. Then, a contact hole 11 is formed in a region located on impurity region 8b in first interlayer insulating layer 10.

Then, a polycrystalline silicon layer 12 is deposited in contact hole 11 and on first interlayer insulating layer 10 by CVD or the like. Polycrystalline silicon layer 12 is patterned into a predetermined shape, whereby a bit line 12 is formed. Bit line 12 may be in a stacked structure of polycrystalline silicon and tungsten silicide (WSi). In this case, tungsten silicide is formed by sputtering or the like.

Then, a second interlayer insulating layer 13 formed of a BPSG film or the like is deposited on bit line 12 by CVD or the like. After second interlayer insulating layer 13 is subjected to reflow, an interconnection layer 14 formed of aluminum or the like is formed on second interlayer insulating layer 13 by sputtering or the like.

Through these steps, the DRAM is formed as shown in FIG. 1. In this methods, impurity regions 8a and 8c serving as source/drain regions of the MOS transistor also serve as one electrode (storage node electrode) of the capacitor, semiconductor substrate 1 also serves as the other electrode (cell plate electrode) of the capacitor, and dielectric layer 2 serves as both the insulating layer of the SOI structure and the dielectric layer of the capacitor. Therefore, unlike the conventional example, formation of one and the other electrodes of the capacitor and the dielectric layer of the capacitor in separate steps is not required. Thus, the manufacturing process can be more simplified than before.

Embodiment 2

Figure 8:
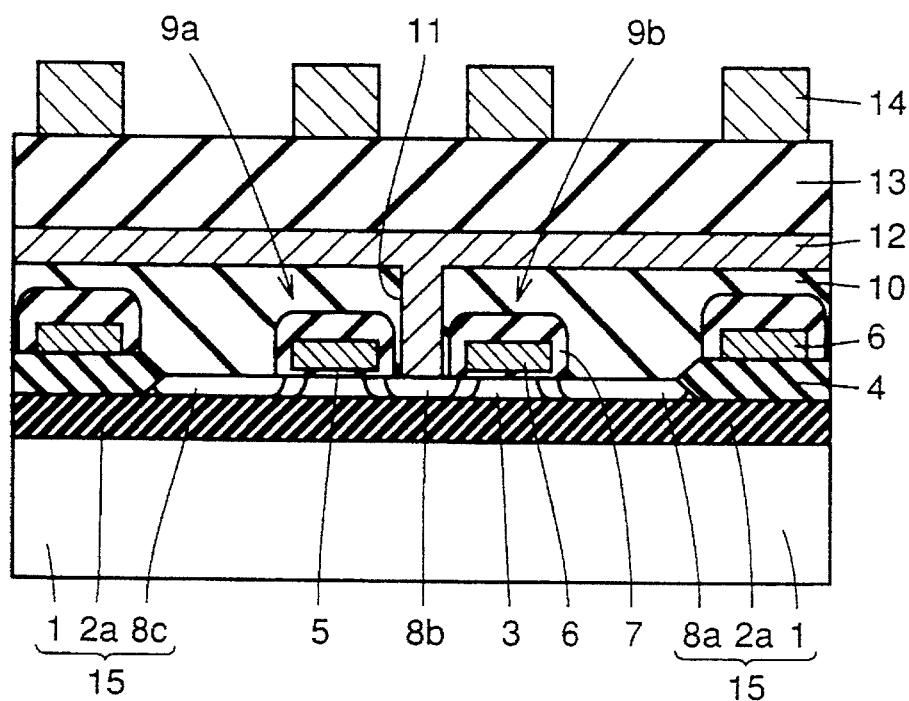
FIG. 8 is a partial sectional view showing a DRAM according to a second embodiment of the present invention.
Figure 9:
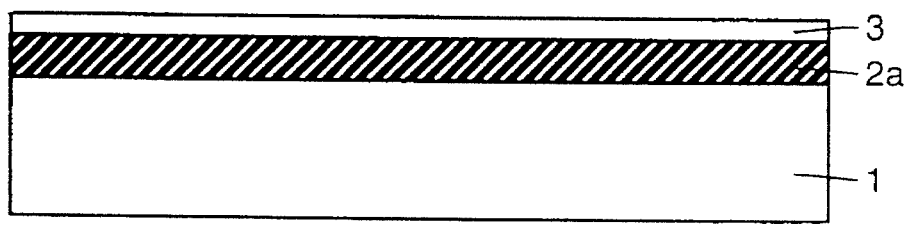
FIG. 9 is a sectional view showing a characteristic step in manufacturing the DRAM according to the second embodiment of the present invention.
Figure 10:
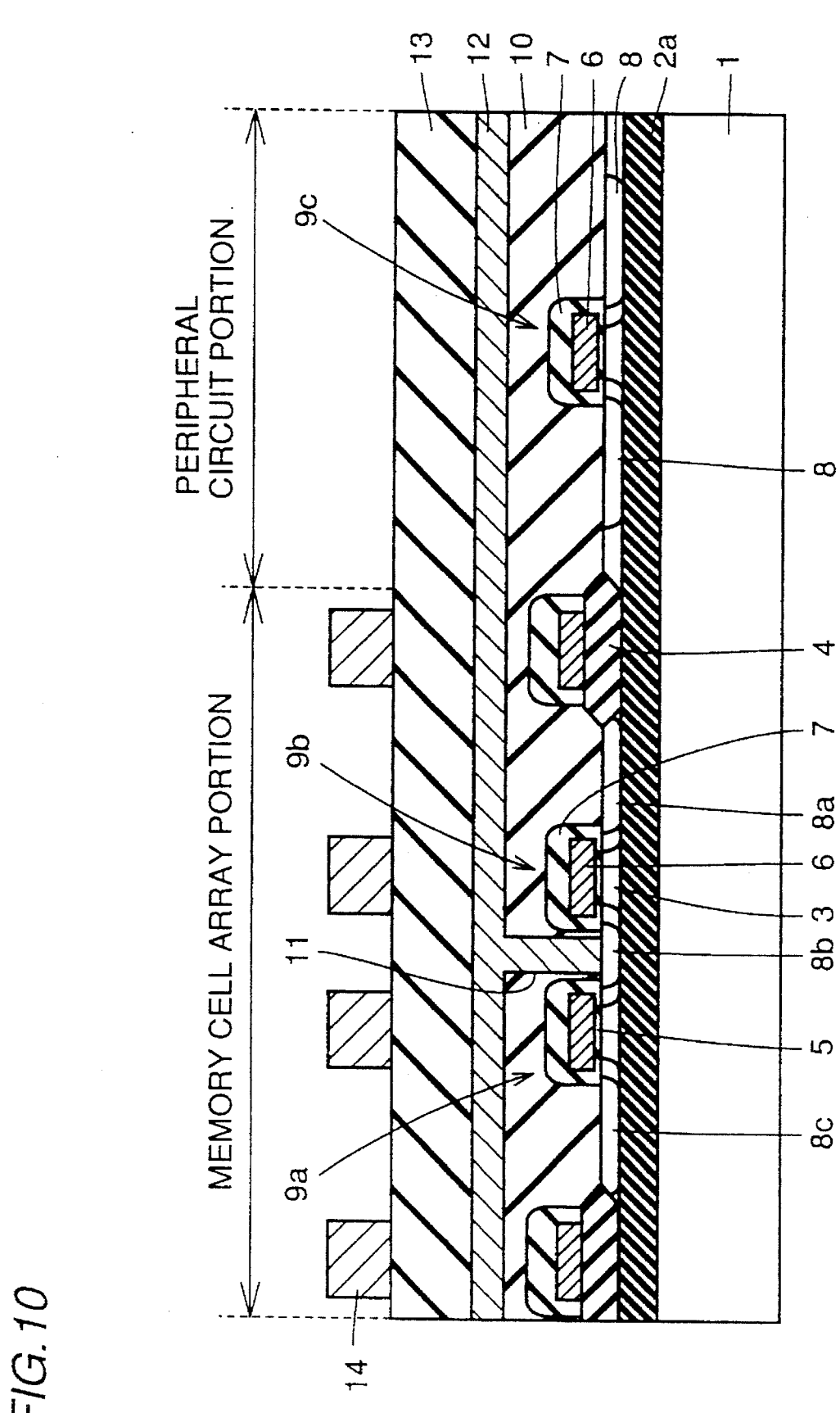
FIG. 10 is a sectional view showing a memory cell array portion and a peripheral circuit portion in the DRAM according to the second embodiment of the present invention.

Now, with reference to FIGS. 8–10, a DRAM according to a second embodiment of the present invention will be described. FIGS. 8 and 10 are partial sectional views showing the DRAM according to the second embodiment of the present invention. FIG. 9 is a partial sectional view showing a characteristic step for manufacturing the DRAM according to the second embodiment of the present invention.

As can be seen from FIGS. 8 and 10, a dielectric layer 2a is formed of a high dielectric material in this embodiment. More specifically, a relative dielectric constant of dielectric layer 2a is larger than that of a silicon oxide film. Preferably, a relative dielectric constant of dielectric layer 2a is 10 or more. Dielectric layer 2a is made of a material such as $Ta_2O_5$, $TiO_2$, (Ba, Sr) $TiO_3$, $SrTiO_3$, PLZT, and PZT.

The other parts of the structure are the same as those in the first embodiment, whereby the same effect as in the first embodiment can be obtained. According to this embodiment, since dielectric layer 2a is formed of the above-described high dielectric material, the capacitance of the capacitor for the same plane area can be increased. Therefore, when it is attempted to secure the same capacitance of the capacitor as in the first embodiment, plane areas of impurity regions 8a and 8c can be reduced. Consequently, the DRAM can be integrated further than in the first embodiment.

Now, a manufacturing method of the DRAM in this embodiment will be described. With reference to FIG. 9, dielectric layer 2a is formed on the main surface of semiconductor substrate by sputtering, CVD or the like. Then, silicon layer 3 is formed on dielectric layer 2a by the same method as in the first embodiment.

Subsequently, the same steps as those in the first embodiment are carried out to form the DRAM shown in FIGS. 8 and 10. Thus, the manufacturing process can be made simpler than before, as in the first embodiment.

Embodiment 3

Figure 11:
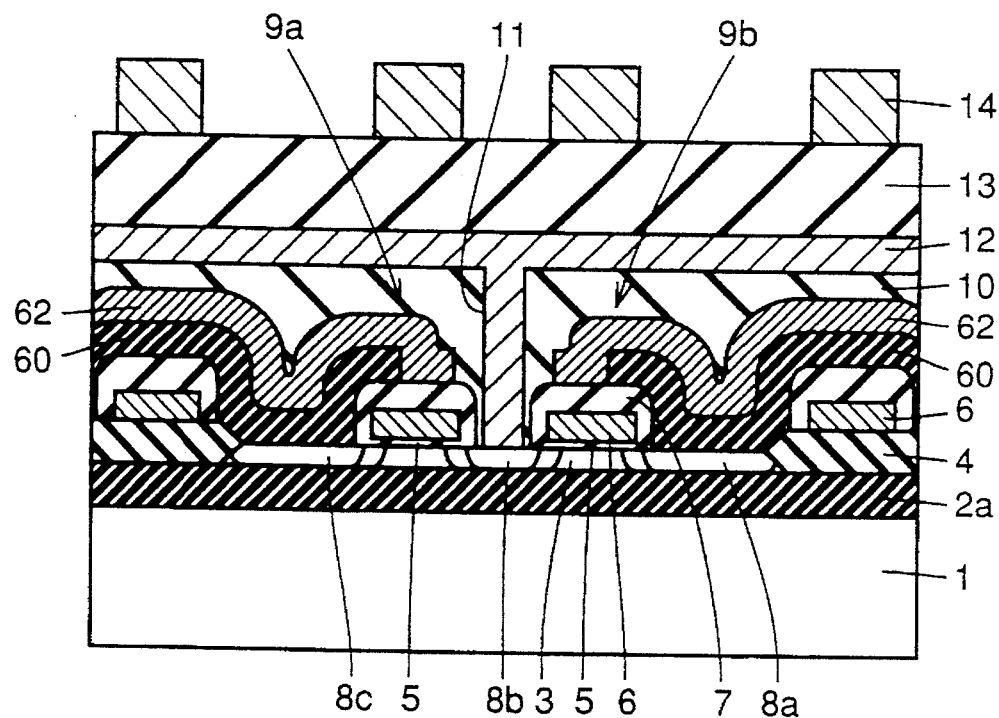
FIG. 11 is a partial sectional view showing a DRAM according to a third embodiment of the present invention.
Figure 12:
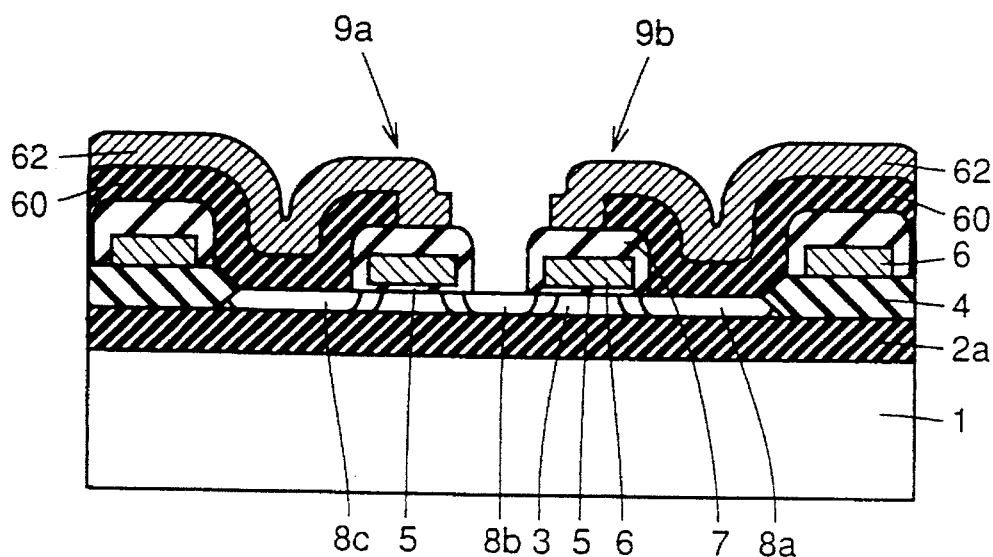
FIGS. 12 and 13 are partial sectional views showing characteristic first and second steps for manufacturing the DRAM according to the third embodiment of the present invention.
Figure 13:
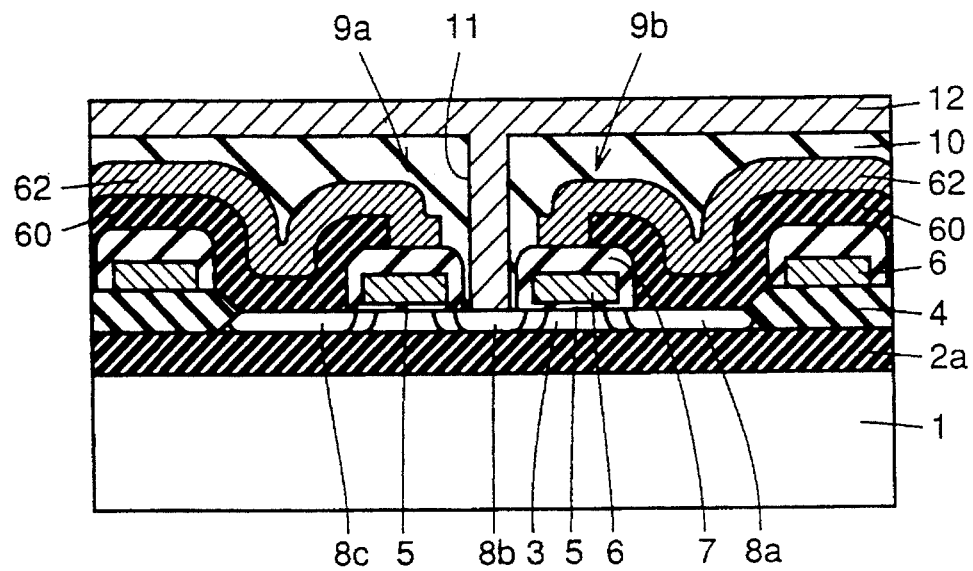

Now, with reference to FIGS. 11–13, a DRAM according to a third embodiment of the present invention will be described. FIG. 11 is a partial sectional view showing the DRAM according to the third embodiment of the present invention. FIGS. 12 and 13 are partial sectional views showing characteristic first and second steps for manufacturing the DRAM according to the third embodiment of the present invention.

With reference to FIG. 11, a structure of the DRAM in this embodiment will be described. As can be seen from FIG. 11, a dielectric layer 60 is also formed on impurity regions 8a and 8c serving as storage node electrodes, and a cell plate electrode 62 is further formed on the dielectric layer 60.

In other words, in this embodiment, two capacitors are stacked in a direction of height of the DRAM. One capacitor is formed by a semiconductor substrate 1, a dielectric layer 2a, and impurity region 8a or 8c, while the other capacitor is formed by impurity region 8a or 8c, dielectric layer 60, and cell plate electrode 62. With such a structure, the capacitance of the capacitor per a unit plane area can be further increased than in the second embodiment. As a result, the DRAM can be integrated further than in the second embodiment.

It is noted that dielectric layer 2 may be used instead of dielectric layer 2a shown in FIG. 11. Also, it is noted that dielectric layer 60 may be made of the same material as that of dielectric layers 2 and 2a. A material for cell plate electrode 62 includes Pt, Au, and a polycrystalline silicon layer having impurities implanted thereinto. One of these materials is appropriately selected depending on a material of dielectric layers 2 and 2a.

Now, with reference to FIGS. 12 and 13, a manufacturing method of the DRAM in this embodiment will be described. With reference to FIG. 12, the steps similar to those in the second embodiment are carried out to form impurity regions 8a, 8b, and 8c. Then, if a high dielectric material is selected as a material of dielectric layer 60, dielectric layer 60 is formed by sputtering, CVD or the like. If a silicon oxide film is selected as a material of dielectric layer 60, dielectric layer 60 is formed by CVD or the like. Then, cell plate electrode 62 is formed by sputtering, CVD or the like.

With reference to FIG. 13, a first interlayer insulating layer 10 and a bit line 12 are formed by the same steps as in the first embodiment. Subsequently, the steps similar to those in the first embodiment are carried out to form the DRAM shown in FIG. 11. In this embodiment, the steps of forming dielectric layer 60 and cell plate electrode 62 are added to the methods of the above first and second embodiments, thus increasing the manufacturing steps. However, when compared to the conventional example, the manufacturing steps can be made simpler than before, since the step of forming the contact portion between the storage node electrode and one impurity region of the MOS transistor can be omitted.

Embodiment 4

Figure 14:
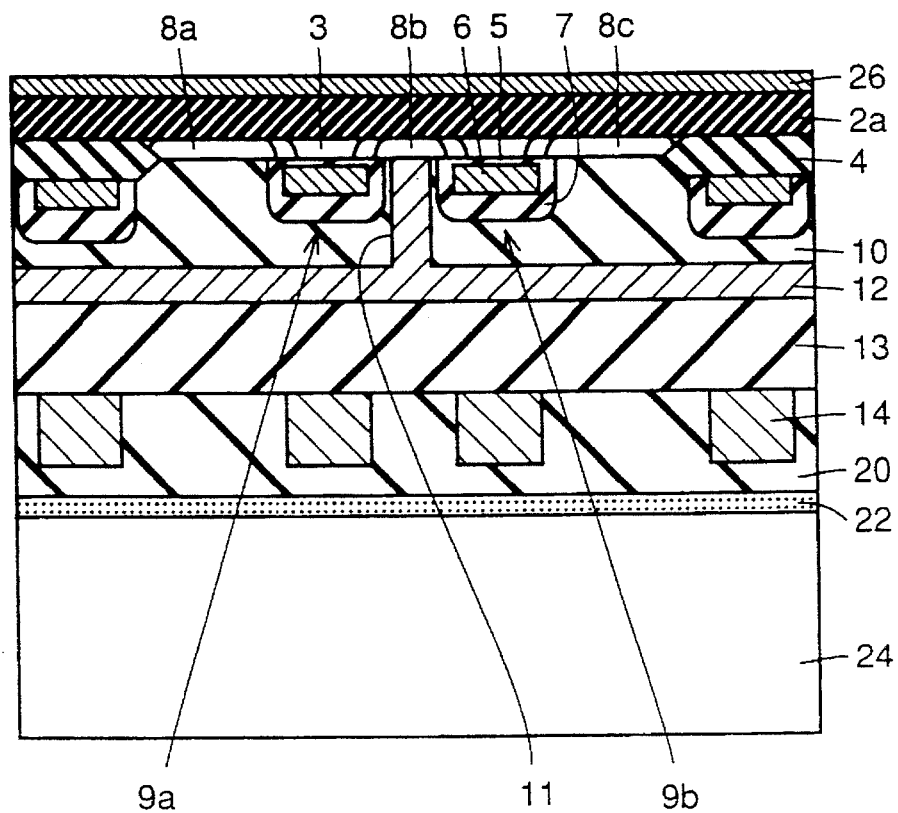
FIG. 14 is a partial sectional view showing a DRAM according to a fourth embodiment of the present invention.
Figure 15:
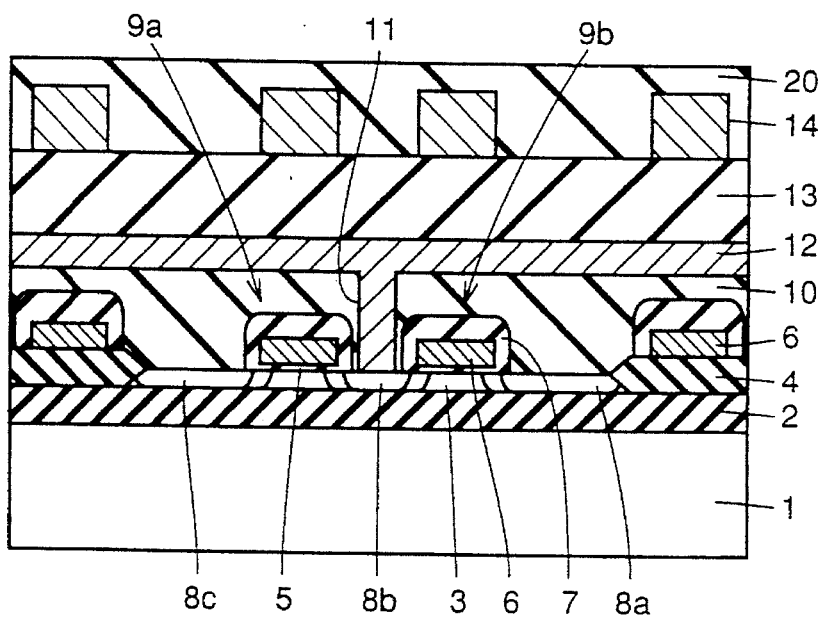
FIGS. 15–18 are partial sectional views showing characteristic first through fourth steps for manufacturing the DRAM according to the fourth embodiment of the present invention.

With reference to FIGS. 14–18, a DRAM according to a fourth embodiment will be described. FIG. 14 is a partial sectional view showing the DRAM according to the fourth embodiment of the present invention. FIGS. 15–18 are partial sectional views showing characteristic first through fourth steps fog manufacturing the DRAM according to the fourth embodiment of the present invention.

With reference to FIG. 14, a structure of the DRAM according to the fourth embodiment will be described. As can be seen from FIG. 14, an interconnection layer structure such as bit line 12 formed on silicon layer 3 in the DRAM of the first embodiment is joined onto a second substrate 24 with a bonding layer 22 interposed therebetween in this embodiment. Also, a cell plate electrode 26 formed of Pt, Au or the like is newly formed on dielectric layer 2a.

The other parts of the structure are the same as those in the DRAM of the first embodiment. Impurity regions 8a, 8b, and 8c may be of a structure other than the LDD (Lightly Doped Drain) structure. This is true in all embodiments.

In this embodiment, a capacitor is formed by cell plate 26, dielectric layer 2a, and impurity region 8a or 8c. In other words, impurity regions 8a and 8c of MOS transistors 9a and 9b and a storage node electrode of the capacitor are formed in the same layer. Also, dielectric layer 2a serves as both an insulating layer of SOI structure and a dielectric layer of capacitor. Therefore, the height of the device can be reduced, although not so much as in the first embodiment. Also, the operating speed of the DRAM can be improved as in the first embodiment.

With reference to FIGS. 15–18, a manufacturing method of the DRAM according to the fourth embodiment of the present invention will be described. As can be seen from FIG. 15, a semiconductor substrate 1 having an SOI structure is prepared. At this time, a dielectric layer 2 is formed on the main surface of semiconductor substrate 1 by the same step as in the first embodiment.

A silicon layer 3 is formed on dielectric layer 2. Subsequently, the steps similar to those in the first embodiment are carried out to form an interconnection layer 14. Then, an insulating layer 20 is formed to cover interconnection layer 14.

Figure 16:
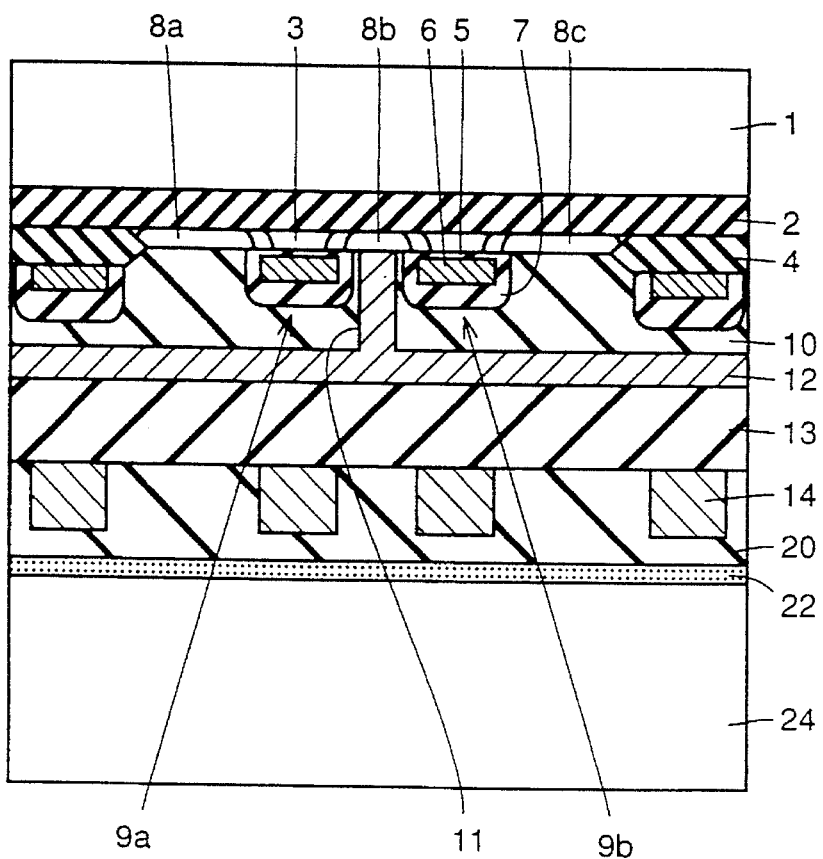
Figure 17:
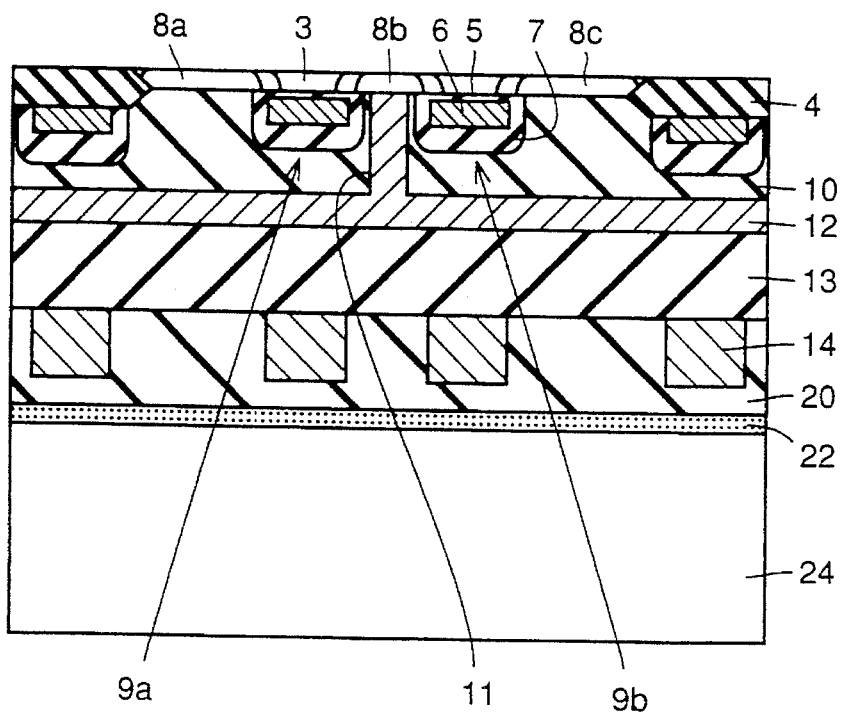

As can be seen from FIG. 16, a second substrate 24 is prepared, and the main surface of second substrate 24 is joined with the top surface of insulating layer 20 by a bonding layer 22. Bonding layer 22 is, for example, an organic adhesive having the coefficient of thermal expansion approximately to that of insulating layer 20 and second substrate 24. Then, as can be seen from FIG. 17, semiconductor substrate 1 and dielectric layer 2 are removed by wet etching, whereby the surface of silicon layer 3 is exposed.

Figure 18:
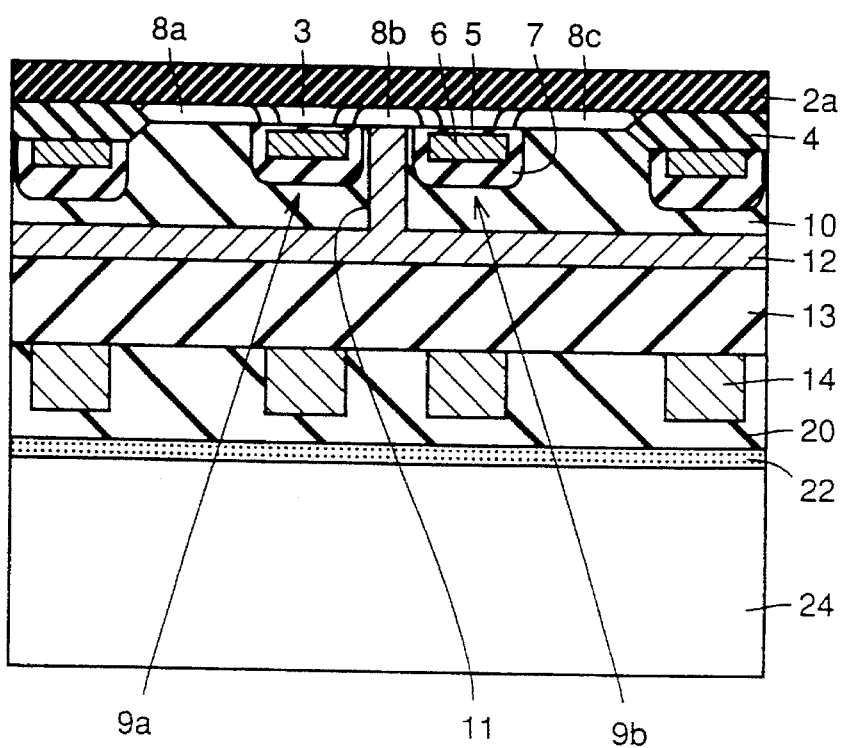

With reference to FIG. 18, a dielectric layer 2a is formed on silicon layer 3 by sputtering, CVD or the like. Then, a cell plate electrode 26 is formed on dielectric layer 2a by sputtering, CVD or the like. At this time, it is preferable to form cell plate electrode 26 at a low temperature of less than 600° C. Through these steps, the DRAM shown in FIG. 14 is formed.

In these manufacturing steps, dielectric layer 2a is formed after formation of first and second interlayer insulating layers 10 and 13 or after formation of MOS transistors 9a and 9b. It is likely that a characteristic such as the dielectric constant of dielectric layer 2a is deteriorated when subjected to heat treatment of a high temperature of more than about 600° C. More specifically, the characteristic of dielectric layer 2a tends to be deteriorated when a high temperature (800° C.–900° C.) is applied to dielectric layer 2a such as in the case during reflow of first and second interlayer insulating layers 10 and 13.

In this embodiment, dielectric layer 2a is formed after all high temperature processings are completed, thus avoiding application of the high temperature to dielectric layer 2a. Therefore, deterioration of the characteristic of dielectric layer 2a can be effectively prevented, although the number of manufacturing steps is somewhat greater than in the first embodiment. Thus, the DRAM having an improved performance can be obtained.

Embodiment 5

Figure 19:
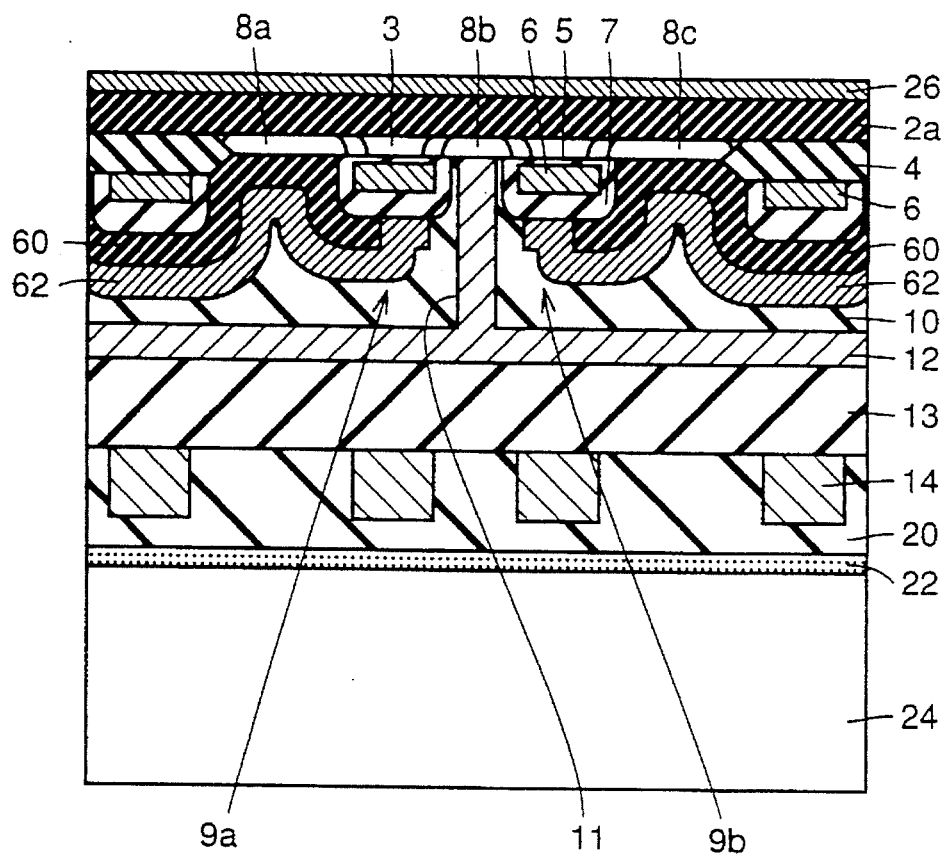
FIG. 19 is a partial sectional view showing a DRAM according to a fifth embodiment of the present invention.
Figure 20:
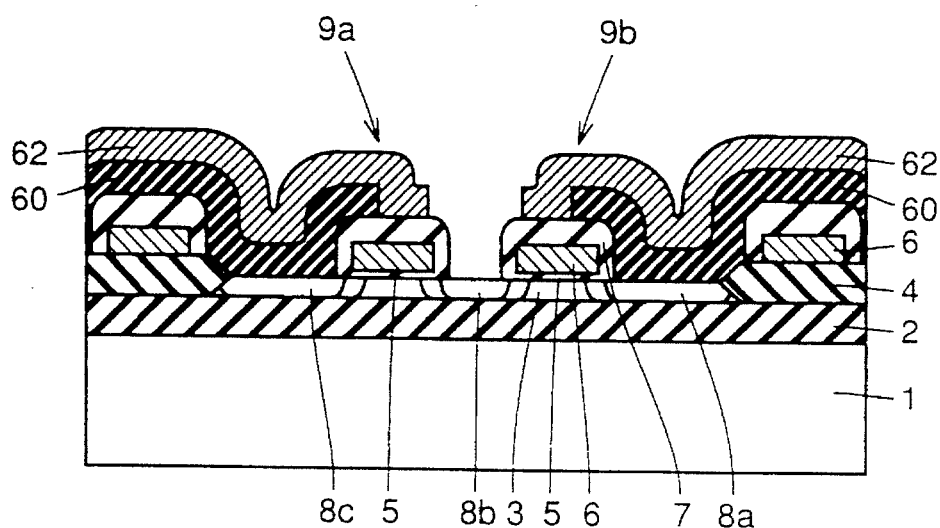
FIG. 20 is a partial sectional view showing a characteristic step for manufacturing the DRAM according to the fifth embodiment of the present invention.

With reference to FIGS. 19 and 20, a fifth embodiment according to the present invention will be described. FIG. 19 is a partial sectional view showing the DRAM according to the fifth embodiment of the present invention. FIG. 20 is a partial sectional view showing a characteristic manufacturing step of the DRAM according to the fifth embodiment.

With reference to FIG. 19, a structure of the DRAM according to the fifth embodiment will be described. As can be seen from FIG. 19, a dielectric layer 60 and a cell plate electrode 62 are added to the structure of the fourth embodiment. This allows higher integration of the DRAM than in the first embodiment, as in the third embodiment. The other parts of the structure are the same as those in the fourth embodiment.

With reference to FIG. 20, a manufacturing method of the DRAM of this embodiment will be described. As can be seen from FIG. 20, the steps similar to those in the first embodiment are conducted to form impurity regions 8a, 8b, and 8c. Then, dielectric layer 60 and cell plate electrode 62 are formed by the same method as in the third embodiment. Subsequently, the steps similar to those in the fourth embodiment are carried out to form the DRAM shown in FIG. 19.

Embodiment 6

Figure 21:
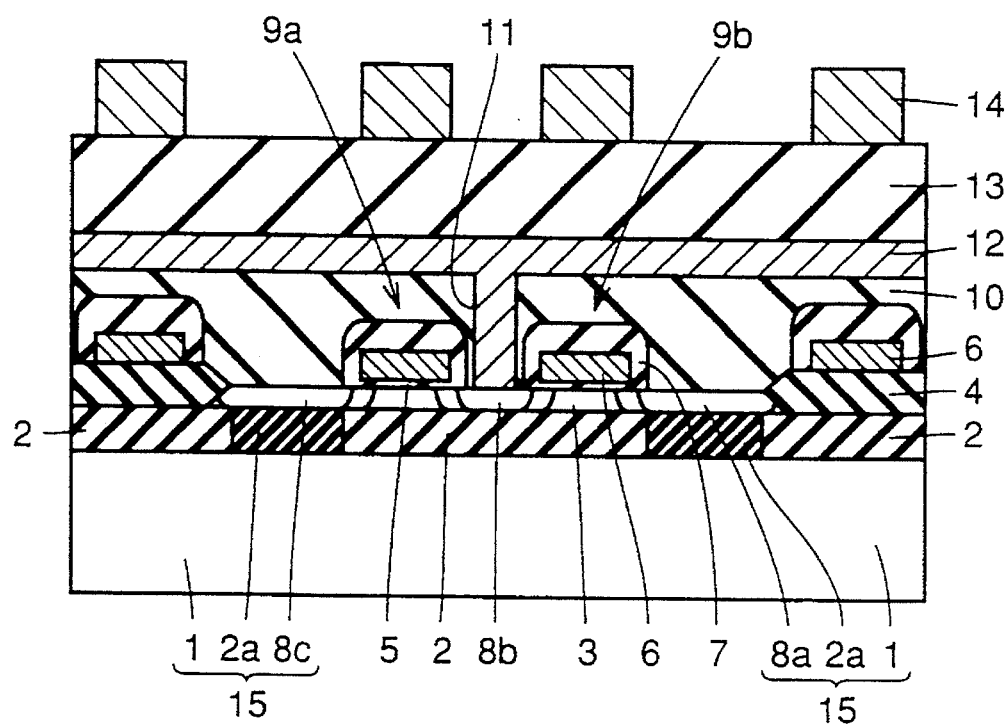
FIG. 21 is a partial sectional view showing a DRAM according to a sixth embodiment of the present invention.
Figure 22:
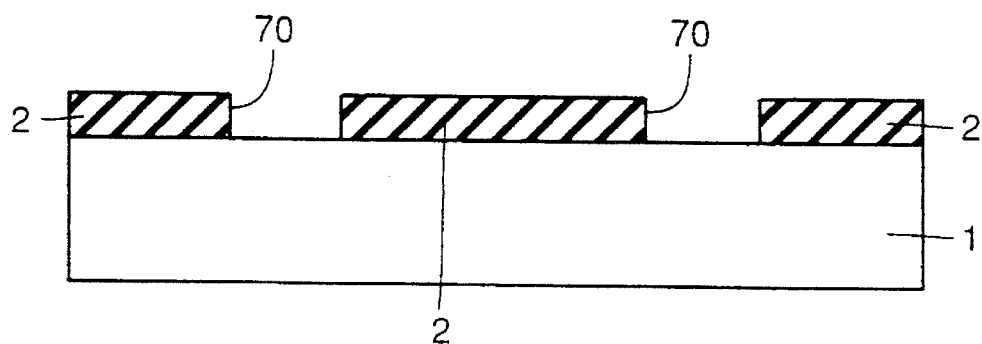
FIGS. 22–25 are partial sectional views showing characteristic first through fourth steps for manufacturing the DRAM according to the sixth embodiment of the present invention.
Figure 24:
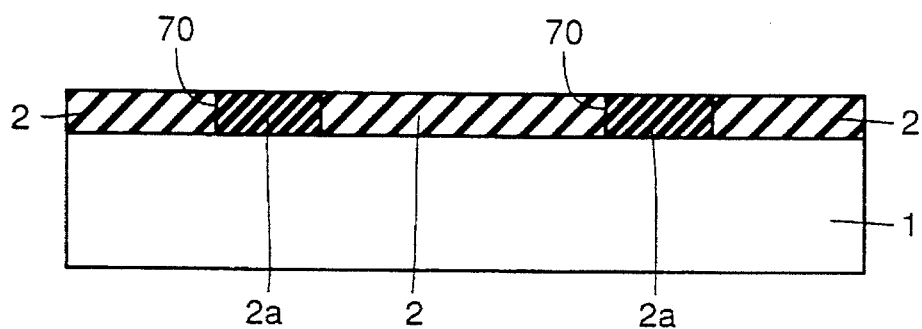
Figure 25:
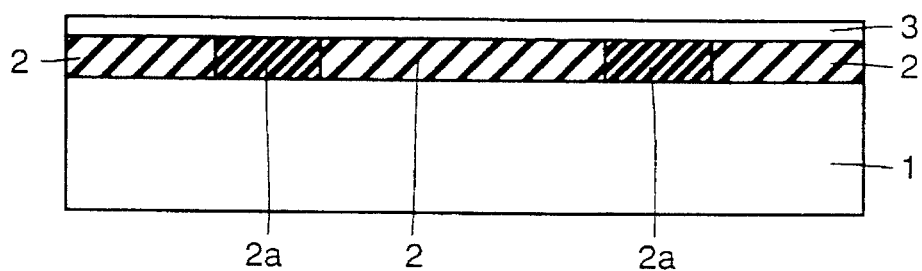
Figure 26:
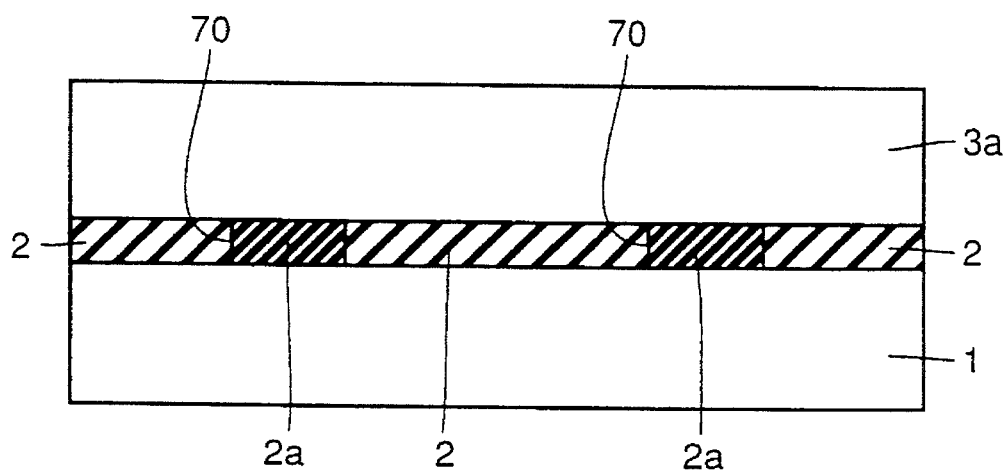
FIGS. 26 and 27 are partial sectional views showing characteristic first and second steps in an alternative method for manufacturing the DRAM according to the sixth embodiment of the present invention.
Figure 27:
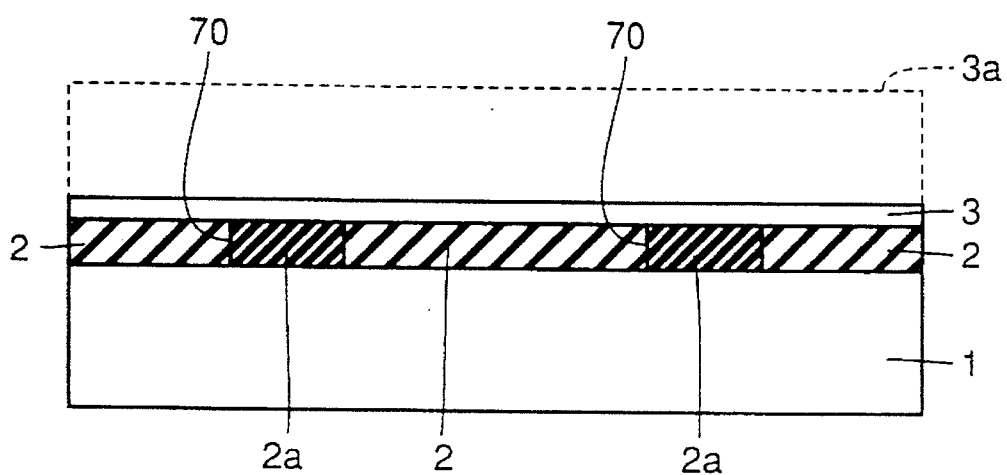

With reference to FIGS. 21–27, a sixth embodiment according to the present invention will be described. FIG. 21 is a partial sectional view of the DRAM according to the sixth embodiment of the present invention. FIGS. 22–25 are partial sectional views showing characteristic first through fourth steps for manufacturing the DRAM according to the sixth embodiment of the present invention. FIGS. 26 and 27 are sectional views showing an alternative example for manufacturing the DRAM according to the sixth embodiment of the present invention.

With reference to FIG. 21, in this embodiment, a dielectric layer 2a is formed only under impurity regions 8a and 8c on the main surface of a semiconductor substrate 1, and in a region other than these regions is provided a dielectric layer 2.

With such a structure, the capacitance of the capacitor can be secured to the same extent as in the second embodiment, and at the same time the parasitic capacitance under the contact portion between bit line 12 and impurity region 8b can be further reduced than in the second embodiment. Thus, high integration of the DRAM can be facilitated and the operating speed of the DRAM can be improved. The other parts of the structure are the same as those in the first and second embodiments.

Now, a manufacturing method of the DRAM of this embodiment will be described. First, with reference to FIG. 22, a dielectric layer 2 is formed on the entire main surface of a semiconductor substrate 1 by the same method as in the first embodiment. By patterning dielectric layer 2 into a predetermined shape, an aperture 70 is formed for exposing selectively a main surface of semiconductor substrate 1.

Figure 23:
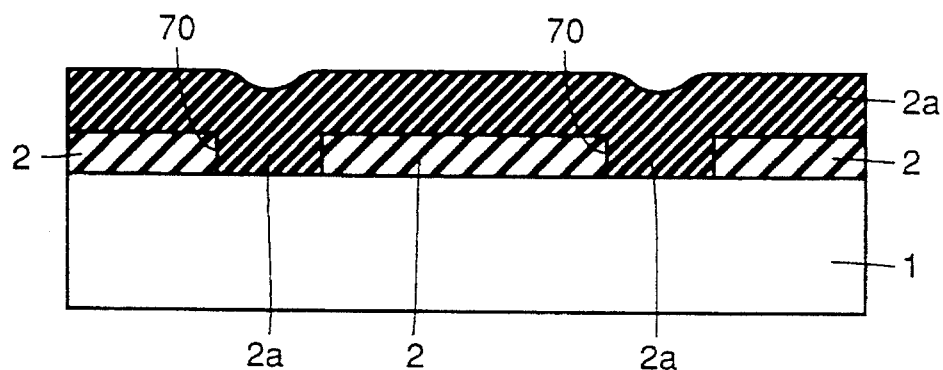

With reference to FIG. 23, a dielectric layer 2a is deposited on the entire main surface of semiconductor substrate 1 by the same method as in the second embodiment. At this time, by adjusting properly a thickness of dielectric layer 2a, aperture 70 is filled with dielectric layer 2a.

With reference to FIG. 24, CMP (Chemical Mechanical Polishing) is carried out to dielectric layer 2a, thus leaving dielectric layer 2a only within aperture 70.

With reference to FIG. 25, a silicon layer 3 is formed on dielectric layers 2 and 2a by the same method as in the first embodiment. Subsequently, the steps similar to those in the first embodiment are carried out to form the DRAM shown in FIG. 21.

In the manufacturing method of the DRAM of this embodiment, the number of manufacturing steps is greater than in the first and second embodiments. However, when compared to the conventional example, the manufacturing process can be simplified, since the step of forming the contact portion for connecting electrically the storage node electrode with one impurity region 8a, 8c of MOS transistor 9a, 9b can be omitted.

Now, with reference to FIGS. 26 and 27, an alternative example of the manufacturing method of the DRAM according to this embodiment will be described. With reference to FIG. 26, a dielectric layer 2 patterned into a predetermined shape is formed on the main surface of a semiconductor substrate 1 by the same method as that described above. Then, a silicon substrate 3a is prepared, on which a dielectric layer 2a is formed selectively.

As can be seen from FIG. 26, the main surface of semiconductor substrate 1 and the main surface of silicon substrate 3a are overlapped such that dielectric layer 2a is sandwiched by dielectric layers 2. Then, silicon substrate 3a is affixed to semiconductor substrate 1 by heat treatment at a temperature of about 1100° C.

At this time, the processing at a high temperature such as 1100° C. is required in the current technique in order to affix silicon substrate 3a to semiconductor substrate 1. Therefore, the use of this method is not preferred for the sake of the characteristic of dielectric layer 2a. However, if a temperature required for affixing silicon substrate 3a to semiconductor substrate 1 is reduced in the future, such a method will be effective.

With reference to FIG. 27, silicon substrate 3a is subjected to, for example, etching in order to reduce the thickness of silicon substrate 3a, whereby a silicon layer 3 is formed. Subsequently, the steps similar to those in the first and second embodiments are carried out to form the DRAM shown in FIG. 21.

Embodiment 7

Figure 28:
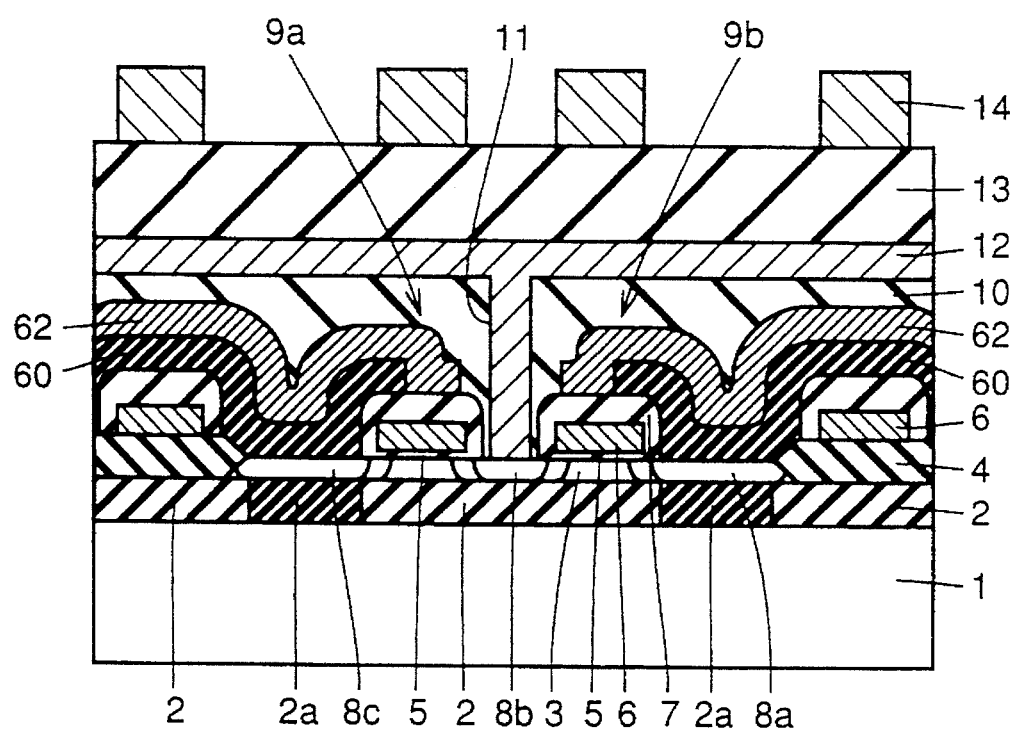
FIG. 28 is a partial sectional view showing a DRAM according to a seventh embodiment of the present invention.

Now, with reference to FIG. 28, a seventh embodiment of the present invention will be described. FIG. 28 is a partial sectional view showing the DRAM according to the seventh embodiment of the present invention.

With reference to FIG. 28, in this embodiment, a dielectric layer 60 and a cell plate electrode 62 are added to the DRAM shown in FIG. 21. Thus, as in the third embodiment, integration of the DRAM can be implemented further than in the sixth embodiment.

As to the manufacturing method, after formation of impurity regions 8a, 8b and 8c through the steps similar to those in the sixth embodiment, the steps as in the third embodiment are carried out to form dielectric layer 60 and cell plate electrode 62. Subsequently, the steps similar to those in the first embodiment are carried out to form the DRAM shown in FIG. 28.

Embodiment 8

Figure 29:
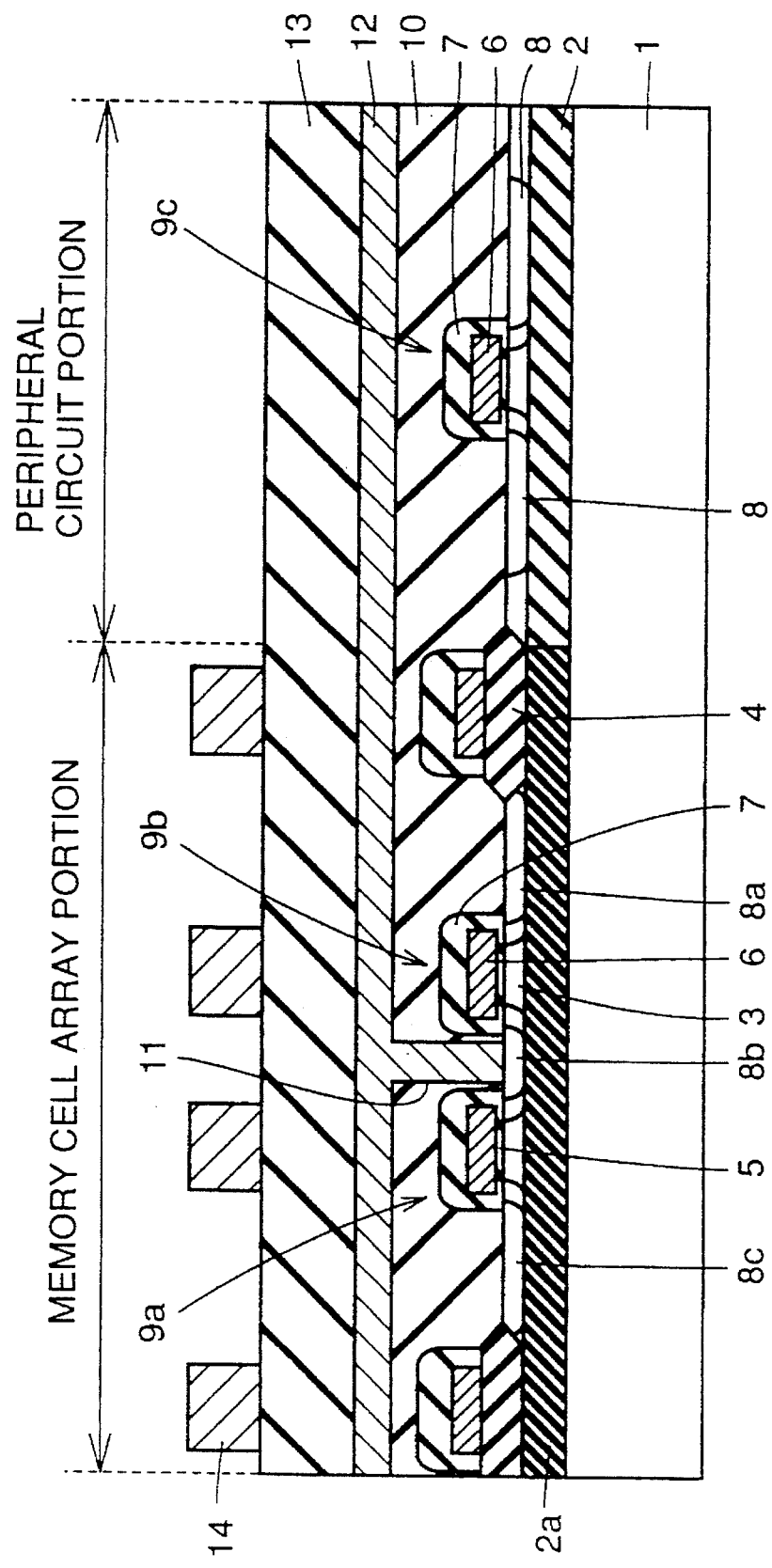
FIG. 29 is a partial sectional view showing a DRAM according to an eighth embodiment of the present invention.
Figure 30:
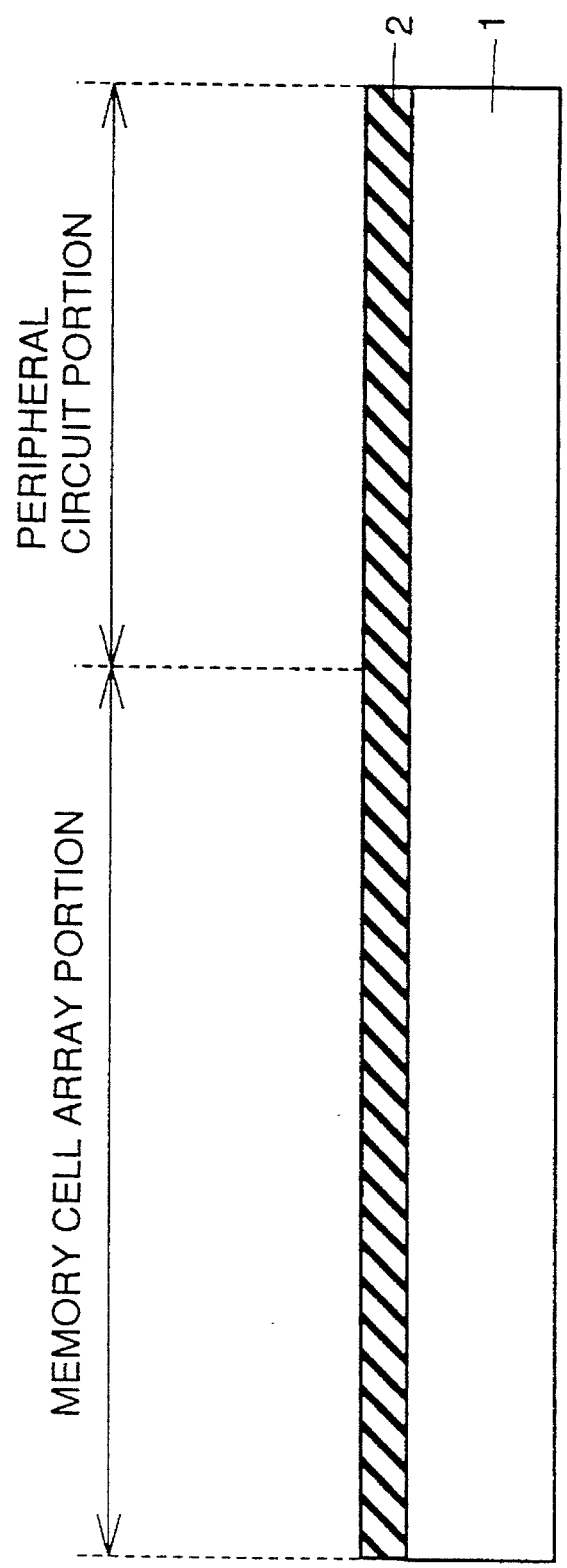
FIGS. 30–34 are partial sectional views showing characteristic first through fifth steps for manufacturing the DRAM according to the eighth embodiment of the present invention.
Figure 31:
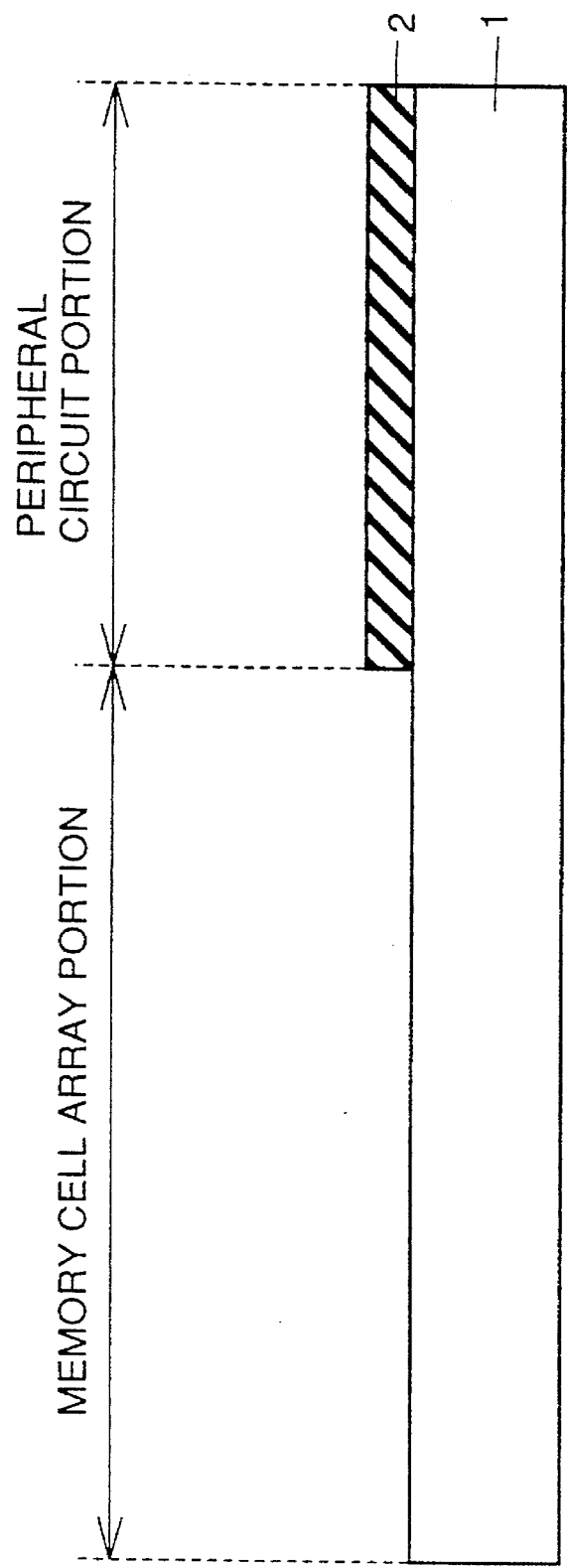

Now, with reference to FIGS. 29–34, an eighth embodiment of the present invention will be described. FIG. 29 is a partial sectional view showing the DRAM according to the eighth embodiment of the present invention. FIGS. 30–34 are partial sectional views showing characteristic first through fifth steps for manufacturing the DRAM in this embodiment.

With reference to FIG. 29, a structure of the DRAM according to the eight embodiment of the present invention will be described. In this embodiment, as can be seen from FIG. 29, a dielectric layer 2a is formed in the memory cell array portion and a dielectric layer 2 is formed in the peripheral circuit portion, respectively. With such a structure, the certain capacitance of the capacitor can easily be secured in the memory cell array portion, while in the peripheral circuit portion the parasitic capacitance can be reduced compared to the case when dielectric layer 2a is formed under MOS transistor 9c. Thus, the performance of the DRAM can be further improved than in the second embodiment.

With reference to FIGS. 30–34, a manufacturing method of the DRAM in this embodiment will be described. First, with reference to FIG. 30, a dielectric layer 2 is formed on the main surface of a semiconductor substrate 1 by the same method as in the first embodiment. Then, with reference to FIG. 31, dielectric layer 2 located in the memory cell array portion is removed by patterning dielectric layer 2 into a predetermined shape, thus leaving dielectric layer 2 only within the peripheral circuit portion.

Figure 32:
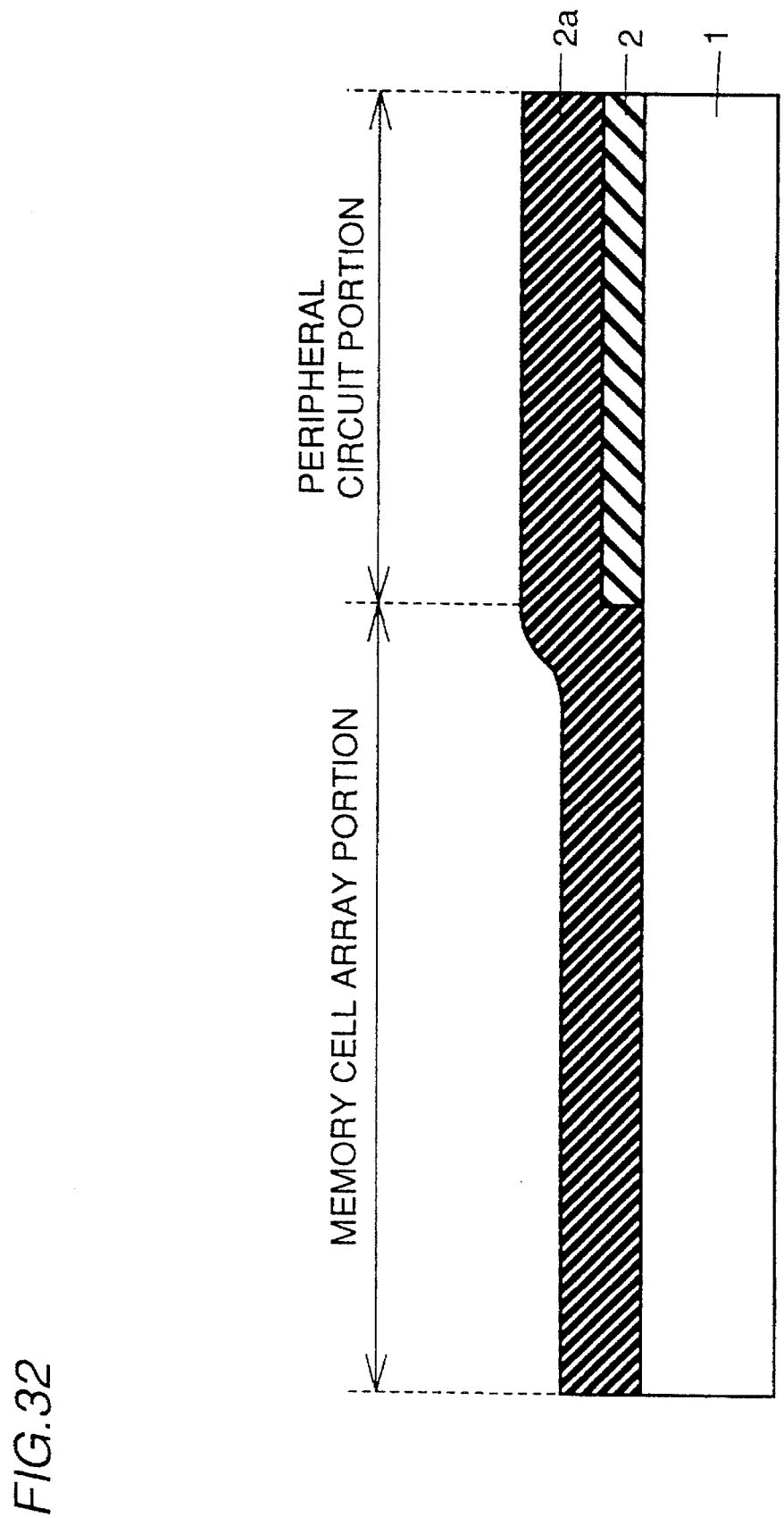
Figure 33:
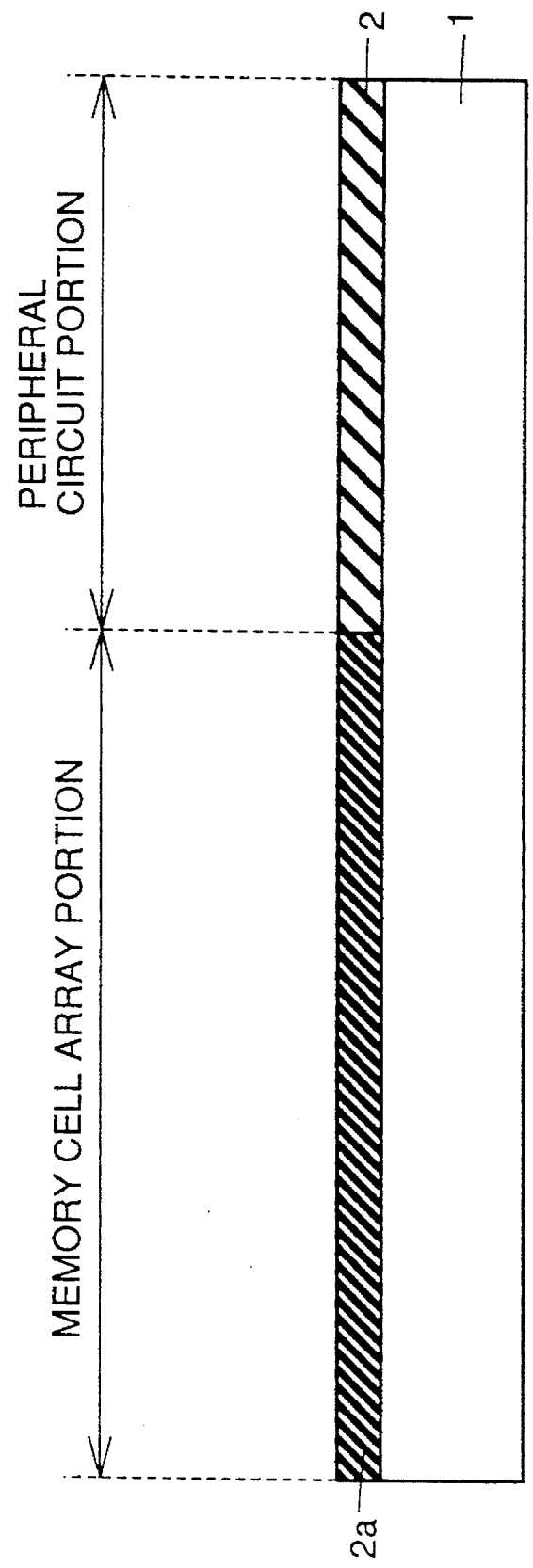
Figure 34:
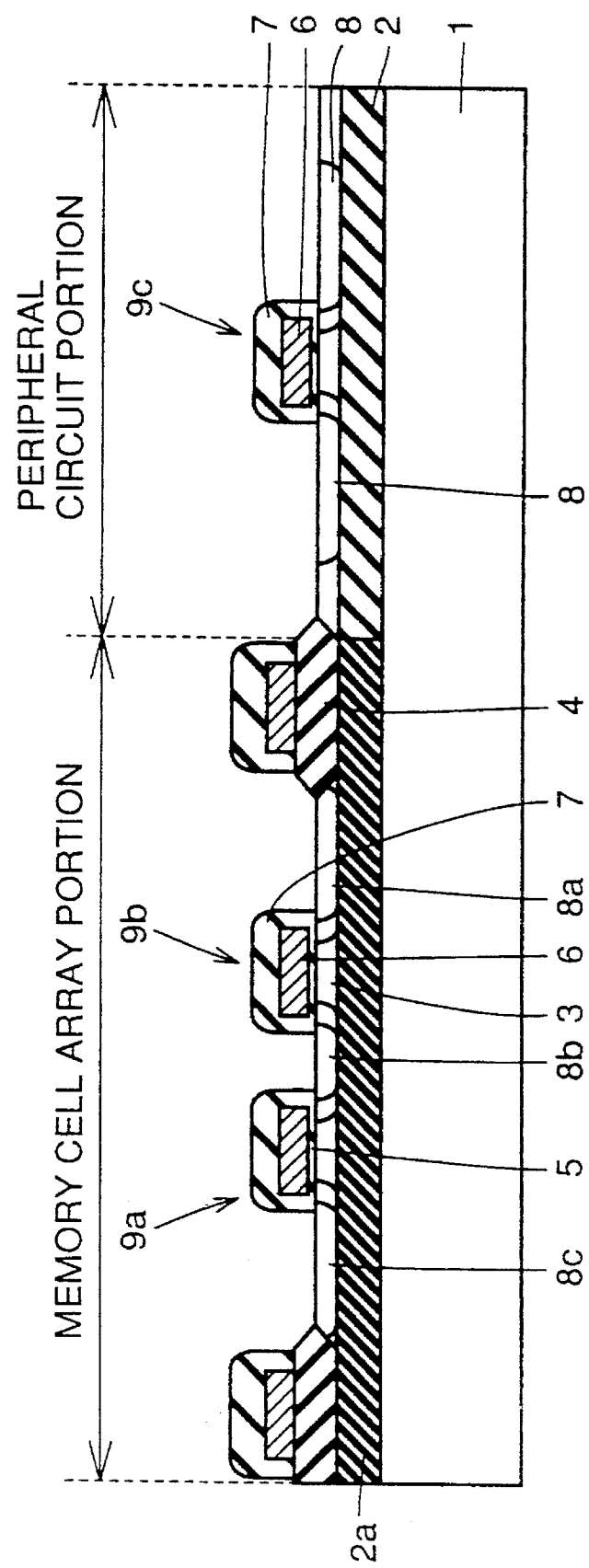

With reference to FIG. 32, a dielectric layer 2a is formed on the entire main surface of semiconductor substrate 1 by the same method as in the second embodiment. Then, as in the sixth embodiment, CMP is conducted to dielectric layer 2a to form a dielectric layer 2a on the main surface of semiconductor substrate 1 located in the memory cell array portion, as shown in FIG. 33. Subsequently, the steps similar to those in the first embodiment are carried out to form MOS transistors 9a, 9b, and 9c, respectively, as shown in FIG. 34. Then, the DRAM shown in FIG. 29 is completed through the steps similar to those in the first embodiment. Thus, also in this embodiment, the manufacturing process can be made simpler than in the conventional example, as in the sixth embodiment.

Embodiment 9

Figure 35:
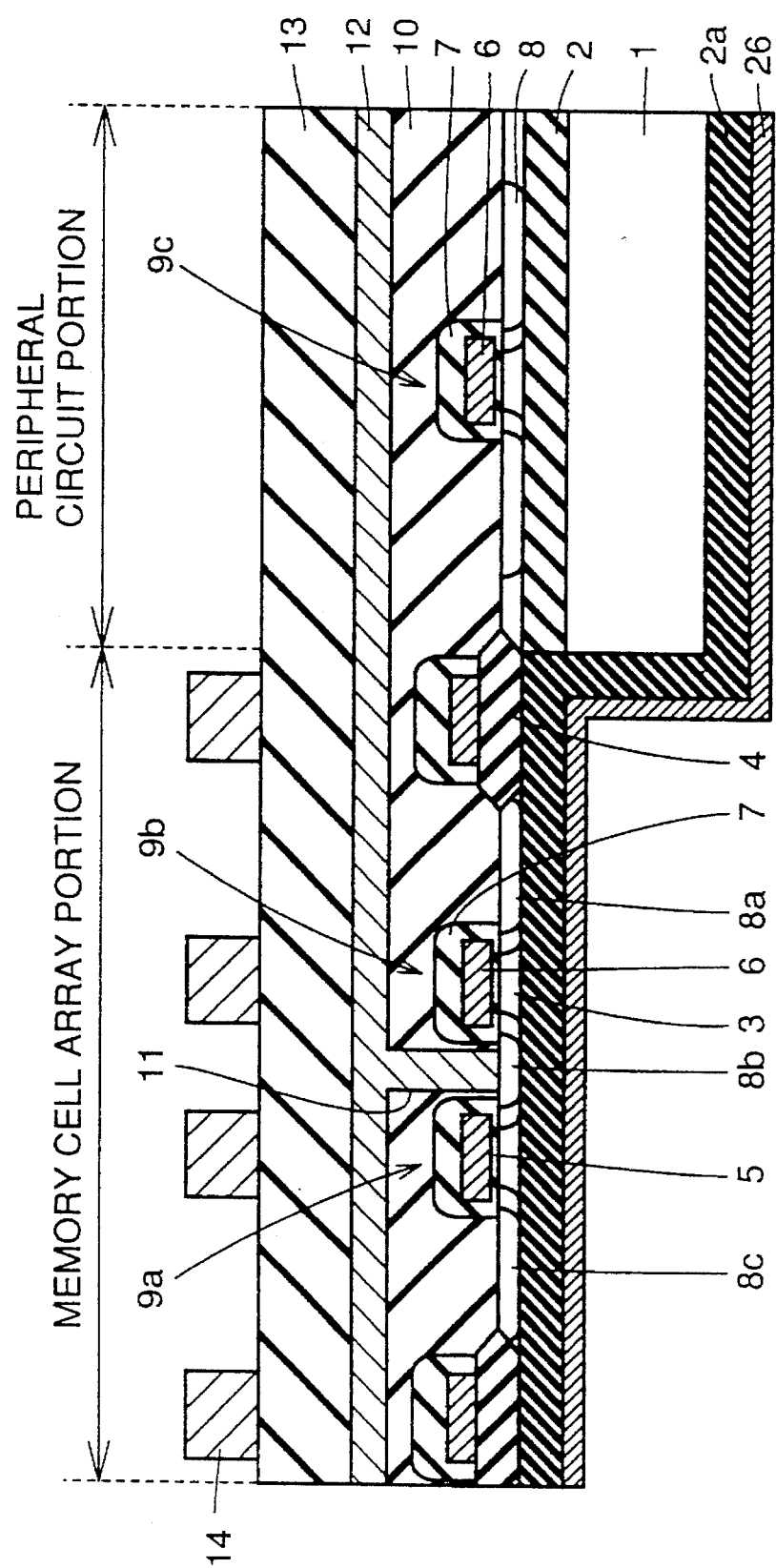
FIG. 35 is a partial sectional view showing a DRAM according to a ninth embodiment of the present invention.

Now, with reference to FIGS. 35–37, a DRAM according to a ninth embodiment of the present invention will be described. FIG. 35 is a partial sectional view showing the DRAM according to the ninth embodiment of the present invention.

Figure 36:
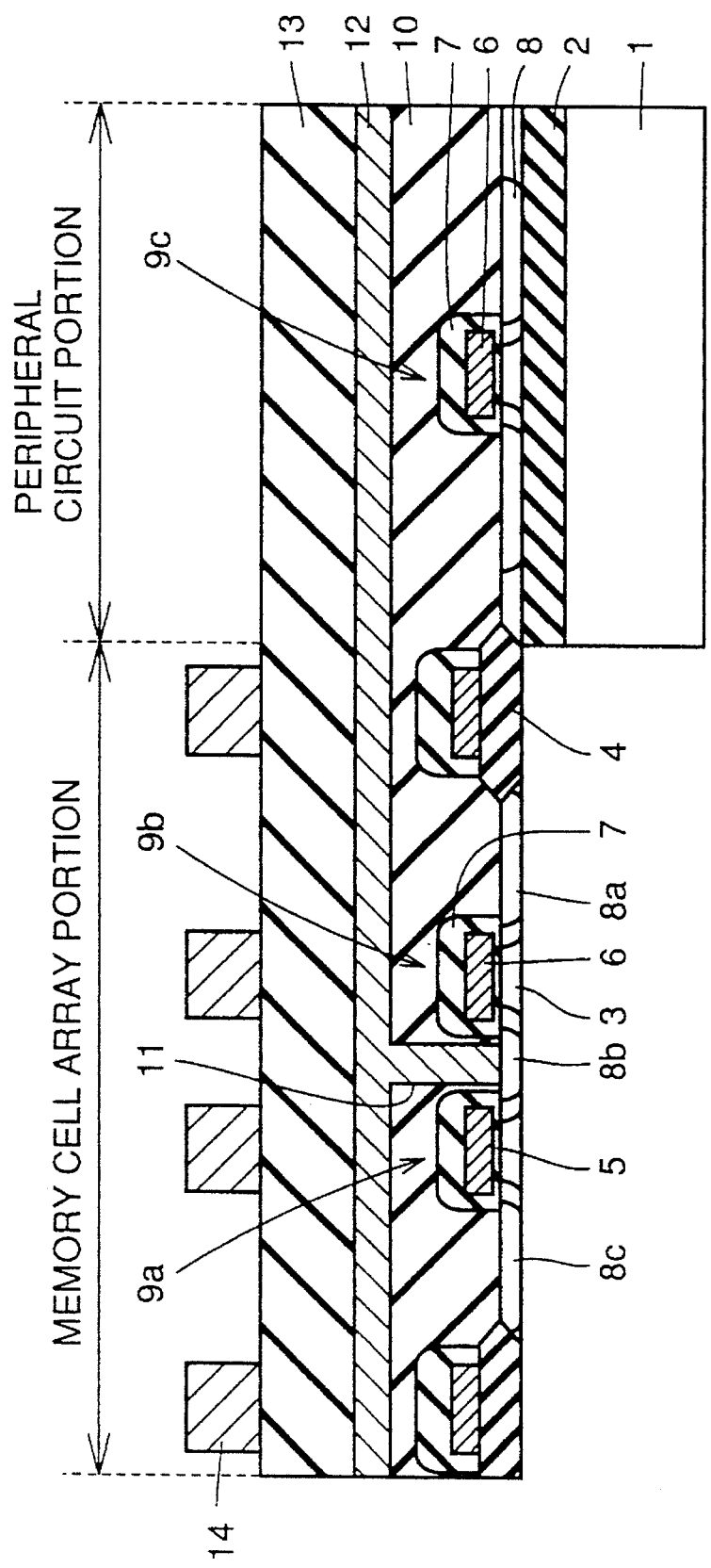
FIGS. 36 and 37 are partial sectional views showing characteristic first and second steps for manufacturing the DRAM according to the ninth embodiment of the present invention.
Figure 37:
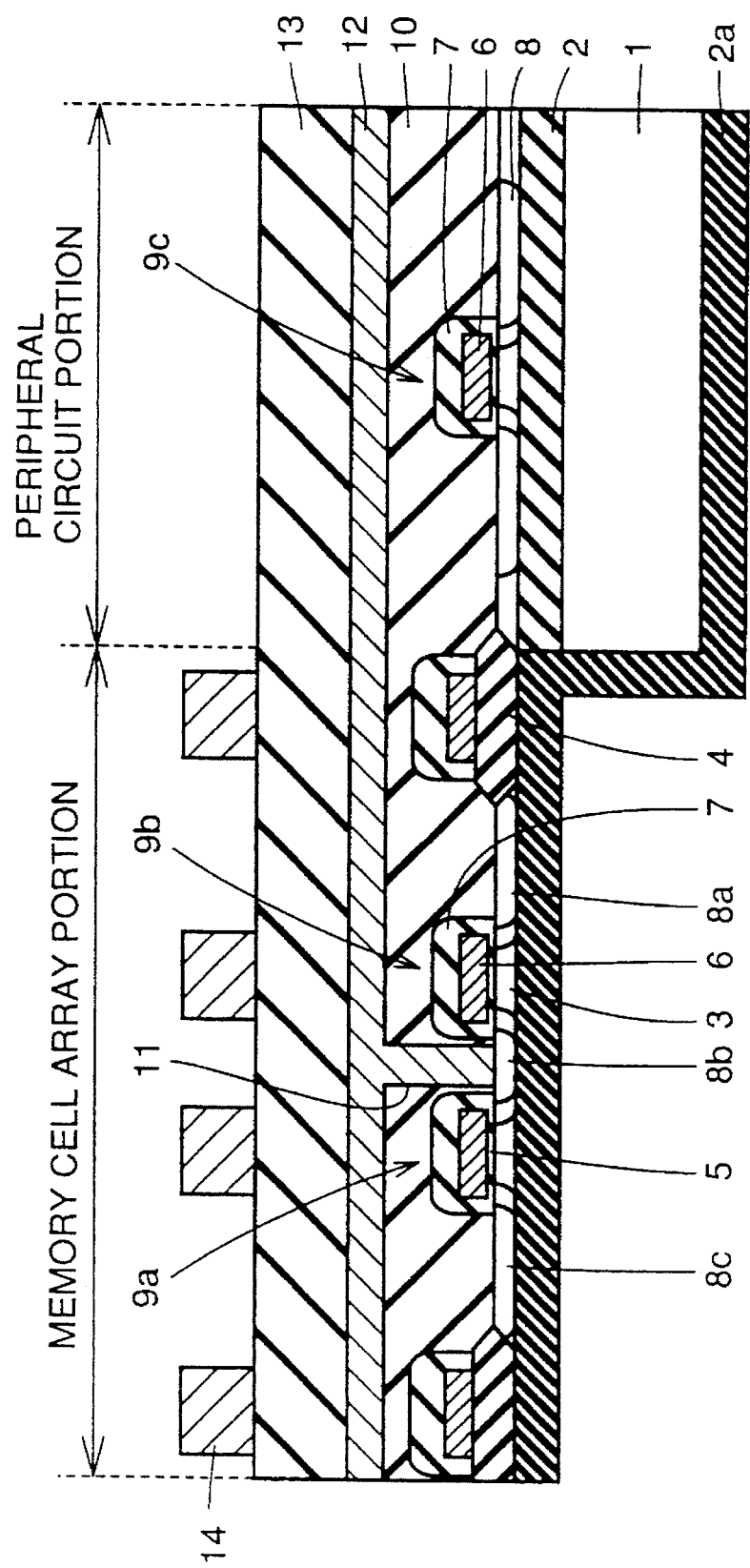

FIGS. 36 and 37 are partial sectional views showing characteristic first and second steps for manufacturing the DRAM shown in FIG. 35.

First, with reference to FIG. 35, a structure of the DRAM according to the ninth embodiment of the present invention will be described. In the DRAM of this embodiment, as can be seen from FIG. 35, a high dielectric layer 2a having a relatively high relative dielectric constant is formed on the surface of silicon layer 3 in the memory cell array portion, while a dielectric layer 2 having a relatively small relative dielectric constant made of, for example, a silicon oxide film is formed on the surface of semiconductor layer 3 in the peripheral circuit portion.

Under dielectric layer 2 is provided a semiconductor substrate 1. Dielectric layer 2a is formed to extend onto as far as the surface of semiconductor substrate 1. A cell plate electrode 26 is formed on dielectric layer 2a. The other parts of the structure are the same as those in the DRAM of the first embodiment shown in FIG. 2. With such a structure, the same effect as in the eighth embodiment can be obtained.

With reference to FIGS. 36 and 37, a manufacturing method of the DRAM according to the ninth embodiment shown in FIG. 35 will be described. With reference to FIG. 36, a semiconductor substrate 1 having the SOI structure is formed by the steps similar to those in the first embodiment. By carrying out the same steps as in the first embodiment, an interconnection layer 14 is formed on semiconductor substrate 1 having the SOI structure. Then, semiconductor substrate 1 and dielectric layer 2 located under the memory cell array portion are removed by wet etching.

With reference to FIG. 37, a dielectric layer 2a is formed on the surface of silicon layer 3 within the memory cell portion and on the surface of semiconductor substrate 1 by sputtering, CVD or the like. Then, a cell plate electrode 26 is formed on dielectric layer 2a by the same method as in the fourth embodiment. Thus, the DRAM shown in FIG. 35 is completed.

As described above, by forming dielectric layer 2a after formation of first and second interlayer insulating layers 10 and 13, deterioration in the characteristic of dielectric layer 2a can be prevented as in the fourth embodiment. Also, since semiconductor substrate 1 and dielectric layer 2 are partially removed, it is unnecessary to join the DRAM to the second substrate again as in the fourth embodiment. Thus, the manufacturing process can be made simpler than in the fourth embodiment.

Embodiment 10

Figure 38:
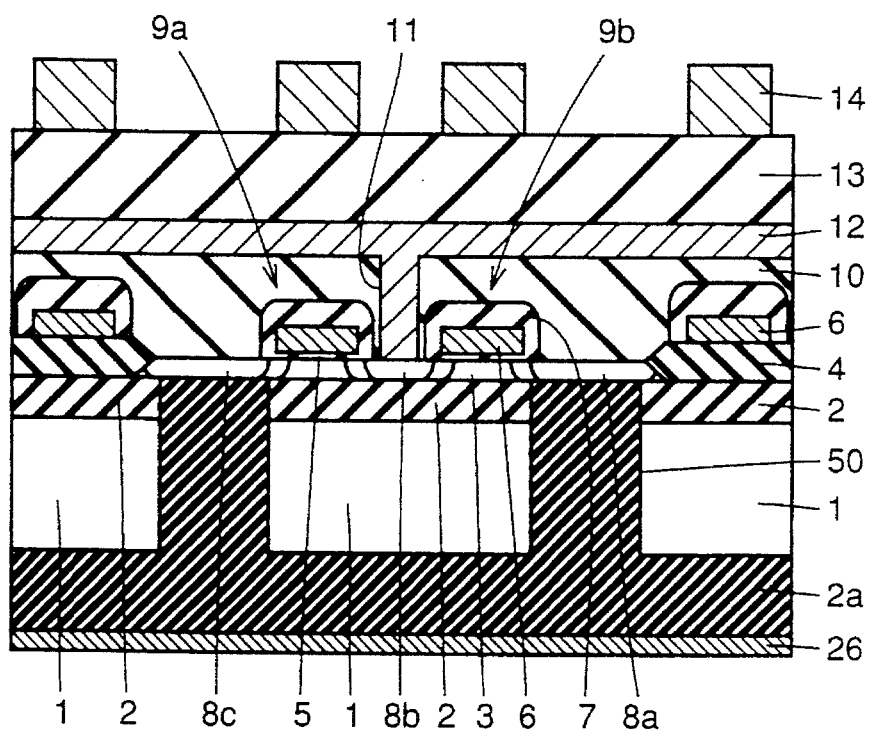
FIG. 38 is a partial sectional view showing a DRAM according to a tenth embodiment of the present invention.
Figure 39:
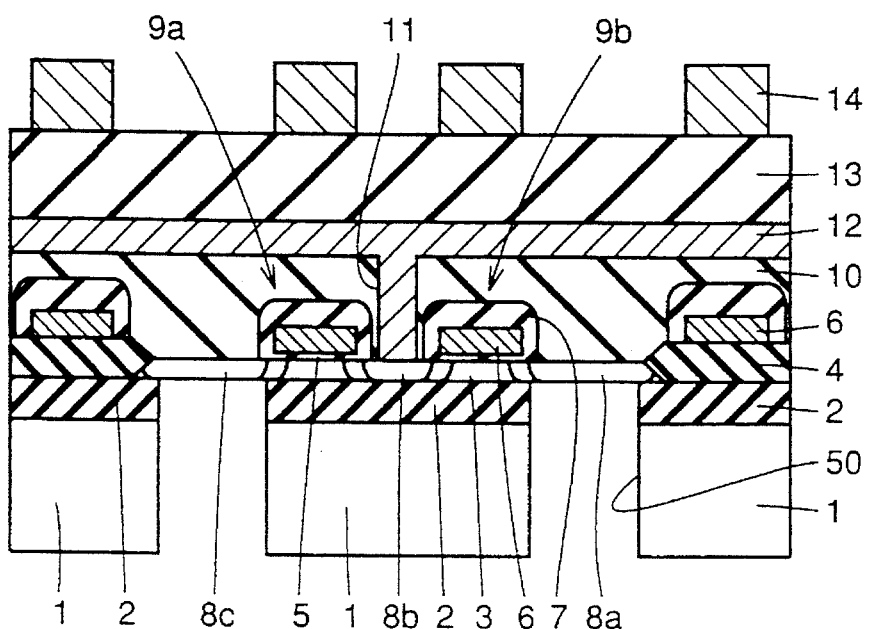
FIGS. 39 and 40 are partial sectional views showing characteristic first and second steps for manufacturing the DRAM according to the tenth embodiment of the present invention.
Figure 40:
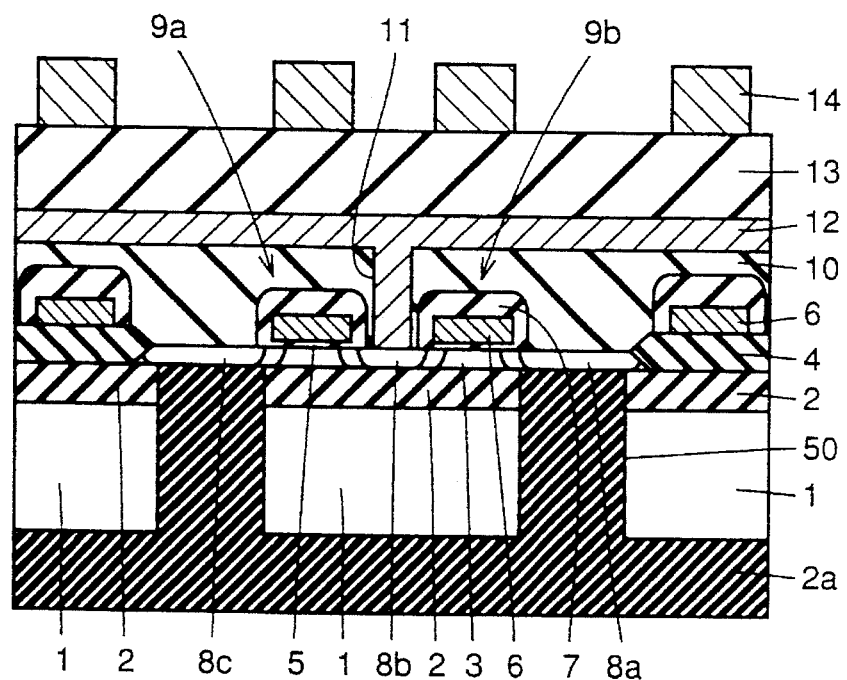

Now, with reference to FIGS. 38–40, a tenth embodiment of the present invention will be described. FIG. 38 is a partial sectional view showing the DRAM according to the tenth embodiment of the present invention. FIGS. 39 and 40 are partial sectional views showing characteristic first and second steps for manufacturing the DRAM shown in FIG. 38.

First, with reference to FIG. 38, in this embodiment, a through hole 50 is provided so as to penetrate through a semiconductor substrate 1 and a dielectric layer 2 having a relatively small relative dielectric constant and serving as an insulating layer for the SOI structure formed on the main surface of semiconductor substrate 1. Then, a dielectric layer 2a is formed within through hole 50 and over the bottom surface of semiconductor substrate 1. A cell plate electrode 26 is formed on dielectric layer 2a. The other parts of the structure of the DRAM are the same as those in the first embodiment.

In this embodiment, the capacitor is formed by one impurity region 8a, 8c of MOS transistor 9a, 9b, dielectric layer 2a, and cell plate electrode 26. Also, dielectric layer 2 having a relatively small relative dielectric constant is formed under the contact portion between impurity region 8b of MOS transistor 9a, 9b and bit line 12. Therefore, performance of DRAM can be improved as in the DRAM of the sixth embodiment. Also, the height of the device can be reduced as in the above-described respective embodiments.

Now, with reference to FIGS. 39 and 40, a manufacturing method of the DRAM in the tenth embodiment shown in FIG. 38 will,be described. The same steps as in the DRAM of the first embodiment are carried out to form an interconnection layer 14. By etching semiconductor layer 1 and dielectric layer 2, a through hole 50 penetrating through semiconductor substrate 1 and dielectric layer 2 is formed under impurity regions 8a and 8c so as to expose a surface of impurity regions 8a and 8c.

With reference to FIG. 40, a dielectric layer 2a is formed in through hole 50 and on the bottom surface of semiconductor substrate. A cell plate 26 is formed on dielectric layer 2a.

In the manufacturing method of the DRAM of this embodiment, dielectric layer 2a can be formed after formation of first and second interlayer insulating layers 10 and 13, whereby deterioration in the characteristic of dielectric layer 2a can be prevented. Also, formation of impurity regions 8a and 8c of MOS transistors 9a and 9b is carried out in the same step as formation of the storage node electrode of capacitor, whereby the manufacturing process can be made simpler than in the conventional example.

Embodiment 11

Figure 41:
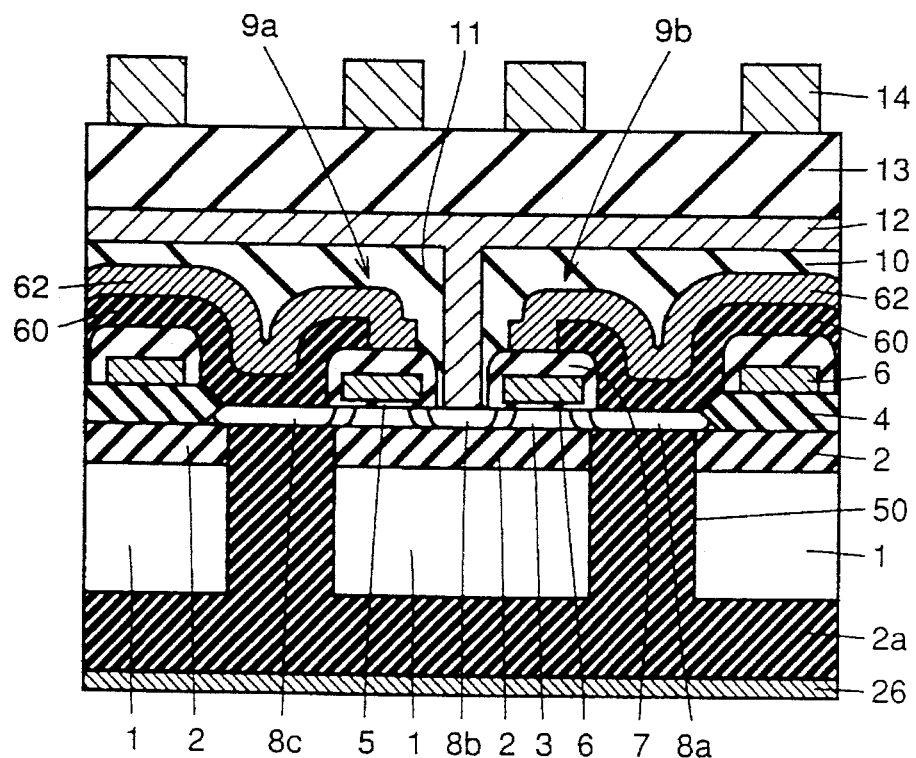
FIG. 41 is a partial sectional view showing a DRAM according to an eleventh embodiment of the present invention.

With reference to FIG. 41, an eleventh embodiment of the present invention will be described. FIG. 41 is a partial sectional view showing a DRAM according to the eleventh embodiment of the present invention. With reference to FIG. 41, in this embodiment, a dielectric layer 60 and a cell plate electrode 62 are added to the DRAM shown in FIG. 38, as in the seventh embodiment. Thus, as in the seventh embodiment, the DRAM can be integrated further than in the tenth embodiment.

Embodiment 12

Figure 42:
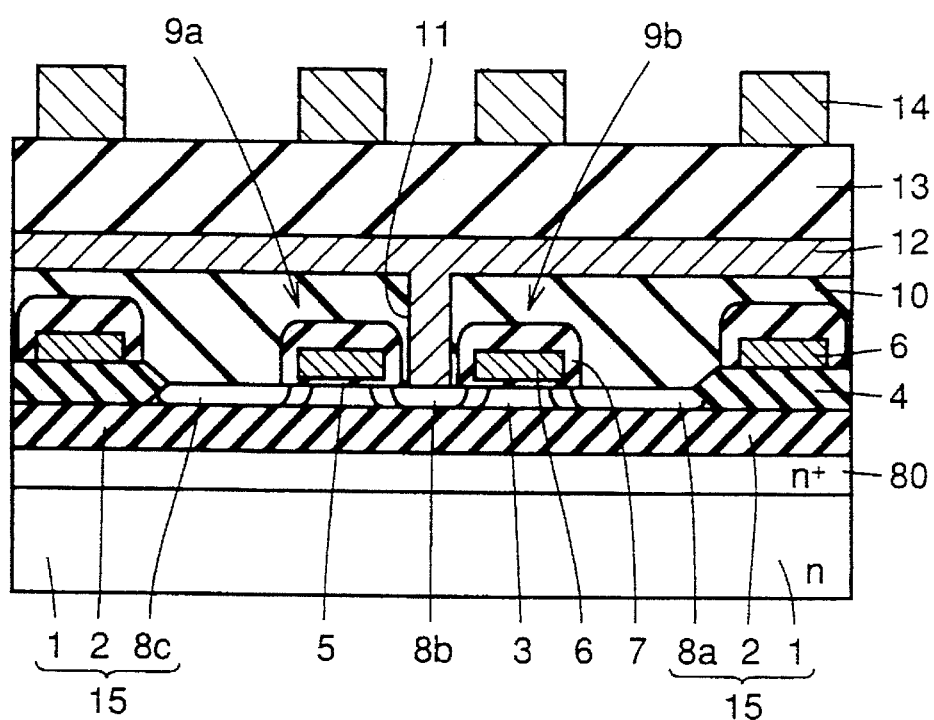
FIG. 42 is a partial sectional view showing a DRAM according to a twelfth embodiment of the present invention.
Figure 43:
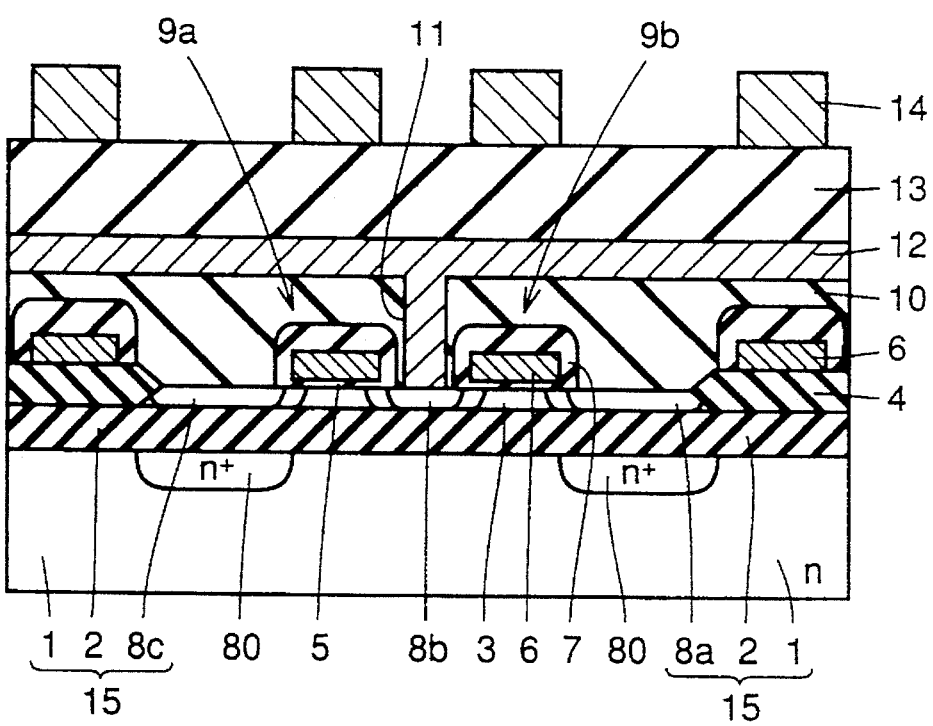
FIG. 43 is a partial sectional view showing an alternative example of the DRAM according to the twelfth embodiment of the present invention.
Figure 44:
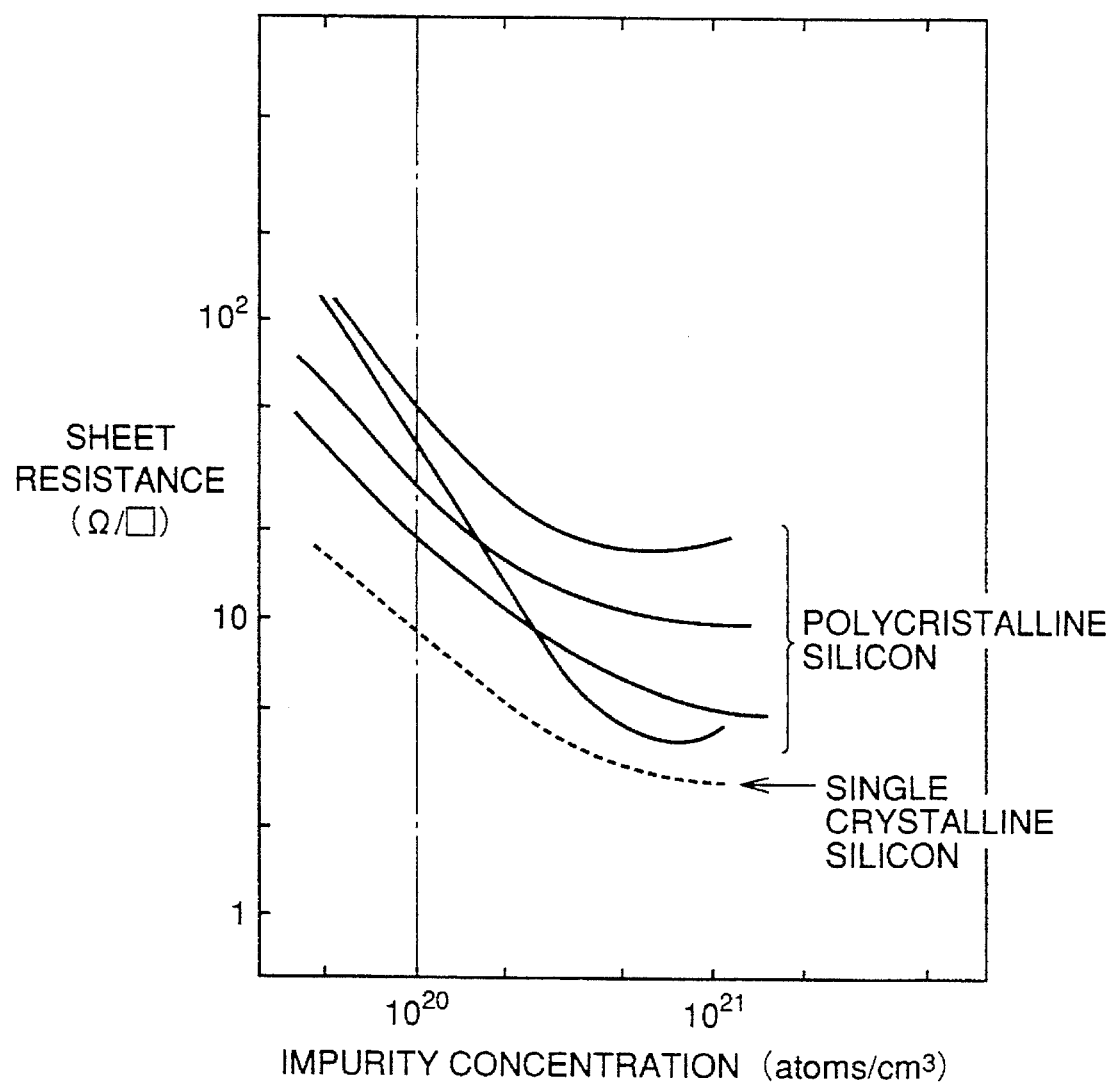
FIG. 44 is a graph showing a relationship between sheet resistance and impurity concentration when an impurity region is formed in single crystalline silicon and in polycrystalline silicon.

Now, with reference to FIGS. 42–44, a twelfth embodiment of the present invention will be described. FIG. 42 is a partial sectional view showing the DRAM according to the twelfth embodiment of the present invention. FIG. 43 is a partial sectional view showing the DRAM in an alternative example of this embodiment. FIG. 44 is a graph showing a relationship between sheet resistance and impurity concentration when impurity regions are formed in single crystalline silicon and polycrystalline silicon.

With reference to FIG. 42, a predetermined amount of n type impurity is introduced into semiconductor substrate 1. Then, an n type impurity region 80 having a high concentration is formed on the surface of semiconductor substrate 1 where a dielectric layer 2 is formed. In other words, n type impurity region 80 having a high concentration is formed at a position opposite to impurity regions 8a and 8b. Thus, the capacitance of the capacitor can be increased compared to that in the first embodiment. The other parts of the structure are as the same as those in the first embodiment.

The concentration of the n type impurity included in impurity region 80 is preferably greater than that of the n type impurity included in impurity regions 8a, 8b, and 8c. More specifically, the concentration of the n type impurity included in impurity region 80 is more than about $1 \times 10^{20}$ cm$^{-3}$. The impurity introduced into semiconductor substrate 1 and impurity region 80 is the n type because the impurity included in impurity regions 8a, 8b, and 8c is the n type impurity. Therefore, if the impurity included in impurity regions 8a, 8b, and 8c is a p type impurity, it is preferable to introduce the p type impurity into semiconductor substrate 1 and impurity region 80. Also, semiconductor substrate 1 is preferably a single crystalline silicon substrate, whereby, a sheet resistance of impurity region 80 can be suppressed to about half the sheet resistance in the case when impurity region 80 is formed in polycrystalline silicon.

With reference to FIG. 43, an alternative example of this embodiment will be described. As can be seen from FIG. 43, impurity region 80 is selectively formed in a region located directly under impurity regions 8a and 8c in the surface of semiconductor substrate 1, whereby substantially the same effect as in the case shown in FIG. 42 can be obtained.

As to formation of impurity region 80, it can be formed by introducing a predetermined impurity into the main surface of semiconductor substrate 1 by, for example, ion implantation prior to formation of dielectric layer 2. Also, impurity region 80 may be formed in other embodiments.

Embodiment 13

Figure 45:
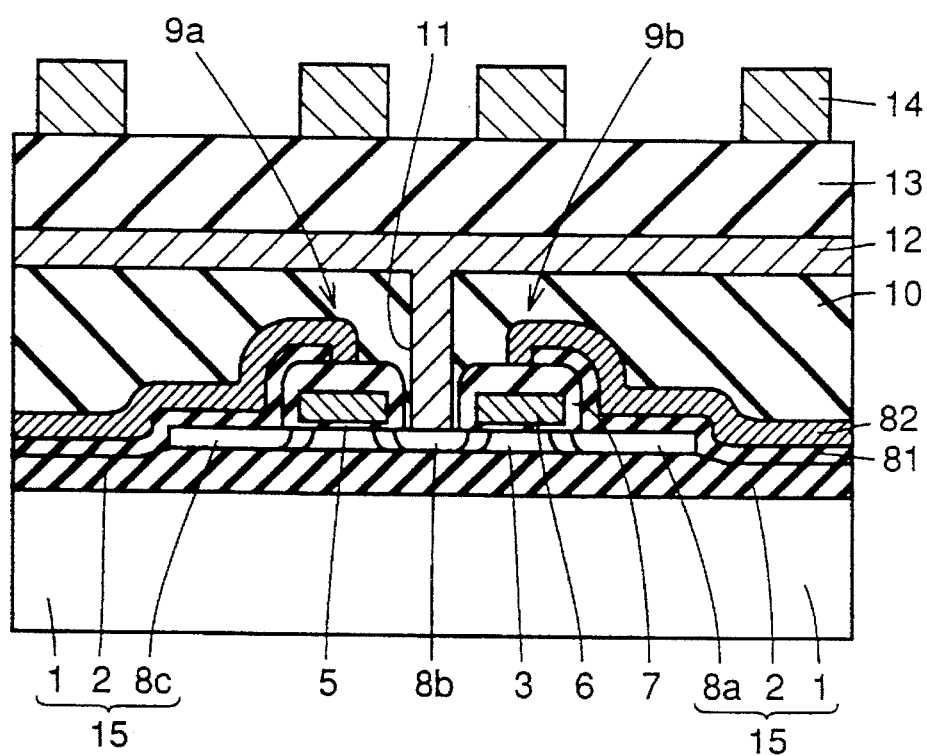
FIG. 45 is a partial sectional view showing a DRAM according to a thirteenth embodiment of the present invention.
Figure 46:
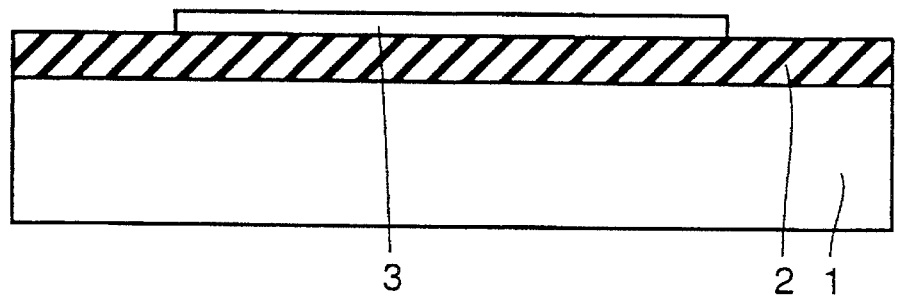
FIGS. 46–49 are partial sectional views showing characteristic first through fourth steps for manufacturing the DRAM according the thirteenth embodiment of the present invention.

With reference to FIGS. 45–49, a thirteenth embodiment of the present invention will be described. FIG. 45 is a partial sectional view showing the DRAM according to the thirteenth embodiment of the present invention. FIGS. 46–49 are partial sectional views showing characteristic first through fourth steps for manufacturing the DRAM shown in FIG. 45.

First, with reference to FIG. 45, unlike the above respective embodiments, a silicon layer 3 is patterned into an island shape in this embodiment. Also, a field oxide film 4 is not formed. Then, a dielectric layer 81 is formed to cover the top and side surfaces of impurity regions 8a and 8c. A cell plate electrode 82 is formed to cover dielectric layer 81. By thus forming dielectric layer 81 also to cover side surfaces of impurity regions 8a and 8c, the capacitance of the capacitor can be further increased. The other parts of the structure are almost the same as those in the first embodiment shown in FIG. 1.

With reference to FIGS. 46–49, a manufacturing method of the DRAM of this embodiment will be described. First, as can be seen from FIG. 46, the same steps as those in the first embodiment are carried out to form a silicon layer 3 having a thickness of about 1000 Å–about 2000 Å, silicon layer 3 is patterned into a predetermined shape by photolithography and etching. More particularly, silicon layer 3 is patterned into an island shape.

Figure 47:
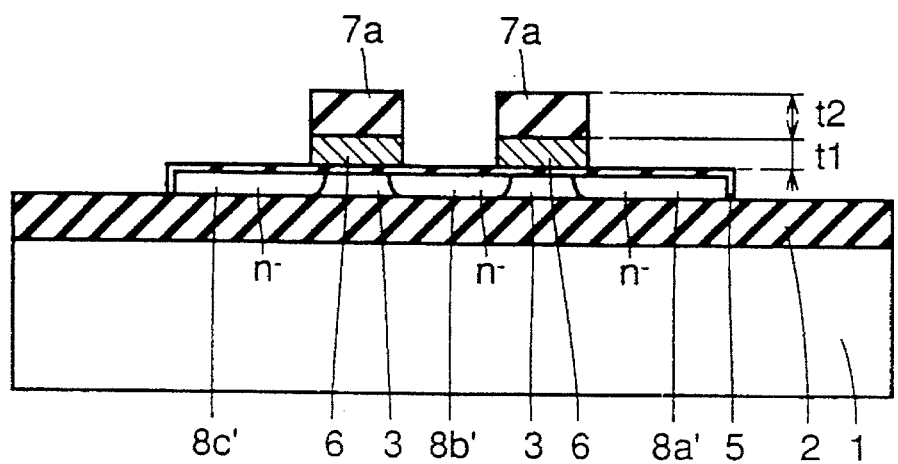

With reference to FIG. 47, a gate insulating layer 5 is formed by thermal oxidation, CVD or the like. Then, a polycrystalline silicon layer 6 having a thickness t1 of about 2000 Å is formed on gate insulating film 5 by, for example, CVD. A silicon oxide film 7a having a thickness t2 of about 2000 Å–about 3000 Å is formed on polycrystalline silicon layer 6. Then, a gate electrode 6 is formed by patterning these silicon oxide film 7a and polycrystalline silicon layer 6 into a predetermined shape. Using gate electrode 6 as a mask, n type impurities are implanted into silicon layer, whereby n impurity regions 8a', 8b' and 8c' are respectively formed.

Figure 48:
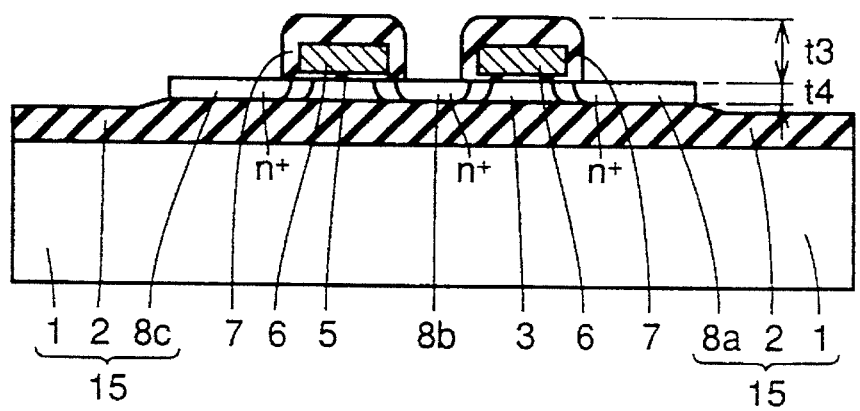

With reference to FIG. 48, a silicon oxide film having a thickness of about 1000 Å is deposited to cover silicon layer 3 and gate electrode 6 by CVD or the like. Then, the silicon oxide film is subjected to anisotropic etching to form a silicon oxide film 7 covering gate electrode 6. At this time, silicon layer 3 has a thickness t4 of about 1000 Å–about 2000 Å which is smaller than thickness t3 of silicon oxide film 7 of about 4000 Å–about 5000 Å. This permits removal of the silicon oxide film by etching such that no silicon oxide film is left on the sidewall of silicon layer 3. Then, using silicon oxide film 7 as a mask, n type impurities are implanted into silicon layer 3, whereby n impurity regions 8a, 8b, and 8c are respectively formed.

Figure 49:
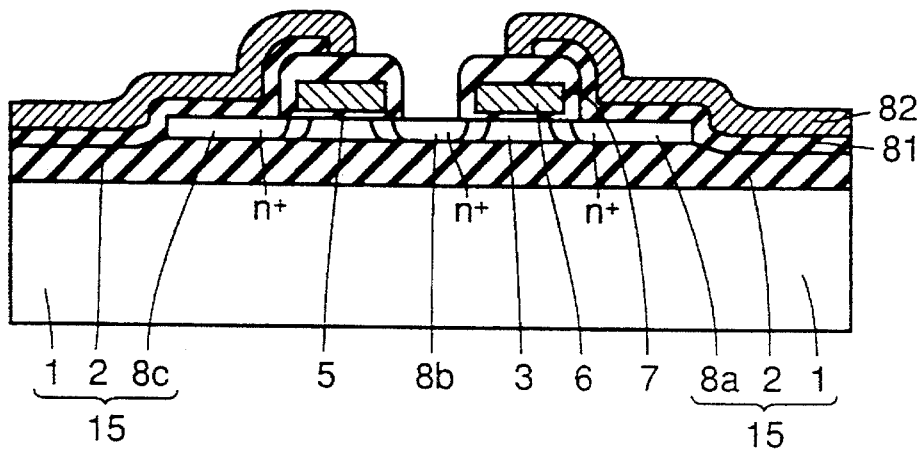
Figure 50:
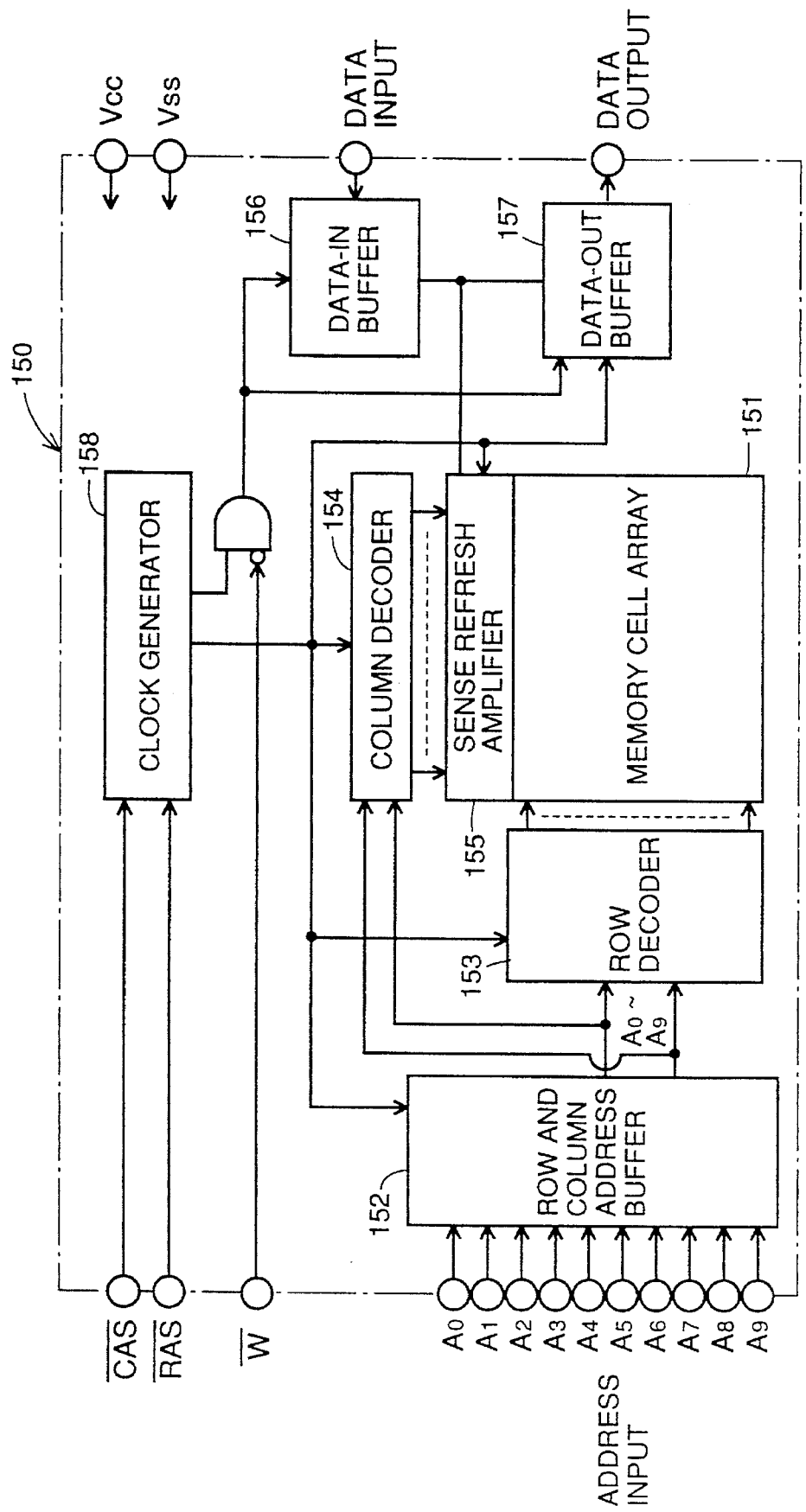
FIG. 50 is a block diagram showing an ordinary structure of a DRAM.
Figure 51:
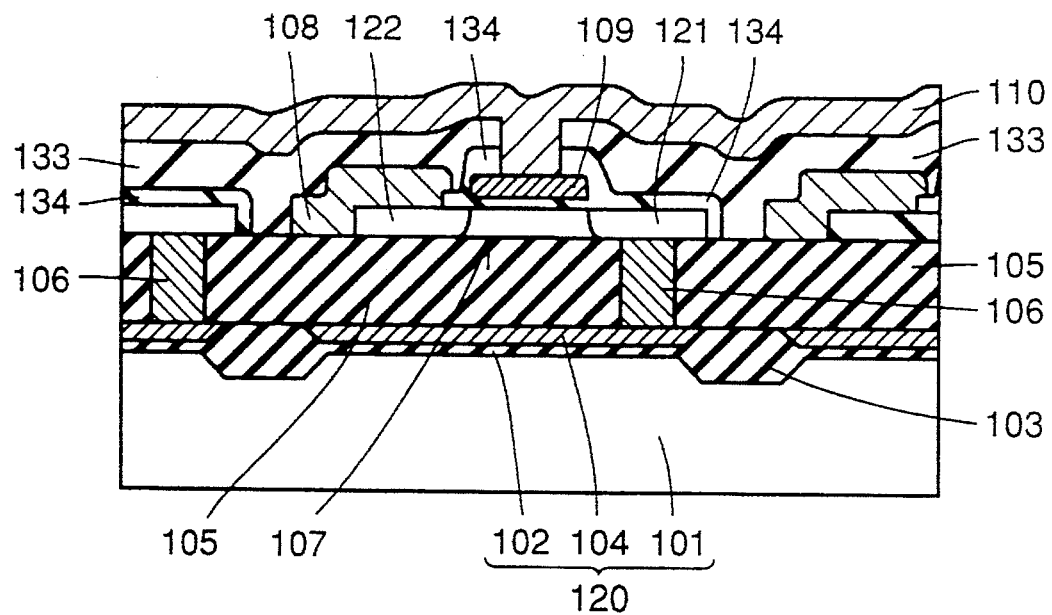
FIG. 51 is a partial sectional view showing an example of a conventional DRAM having an SOI structure.

With reference to FIG. 49, a dielectric layer 81 and a cell plate electrode 82 are respectively formed by CVD or sputtering. Then, dielectric layer 81 and cell plate electrode 82 are patterned into a predetermined shape. Subsequently, the steps similar to those in the first embodiment are carried out to form the DRAM shown in FIG. 45.

Having thus described various embodiments in the above, characteristic portions of respective embodiments can be applied to other embodiments.

As described above, in a semiconductor memory device having an SOI structure according to the present invention, at least one component of a MOS transistor and a capacitor constituting one memory cell of the semiconductor memory device can be shared. Therefore, the height of the semiconductor memory device can be reduced and the performance of the semiconductor memory device can be improved. Further, a structure of the semiconductor memory device can be simplified, so as to achieve the simplified manufacturing process and to allow high integration of the semi,conductor memory device.

Thus, in the semiconductor memory device having the SOI structure according to the present invention, such a structure that achieves the high performance and allows high integration can easily be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having an SOI structure, comprising:

a dielectric layer having opposing first and second surfaces;

a semiconductor layer formed on said first surface of said dielectric layer;

a conductive layer formed on said second surface of said dielectric layer;

first and second impurity regions formed to define a channel region in said semiconductor layer; and a gate electrode formed on said channel region with an insulating layer interposed therebetween, wherein a capacitor is formed by said first impurity region, said dielectric layer opposing said first impurity region, and said conductive layer, wherein said conductive layer is a semiconductor substrate, and wherein said semiconductor substrate is made of single crystalline silicon, a first conductivity type impurity having a first concentration is introduced into said semiconductor substrate, and a third impurity region including the first conductivity type impurity having a second concentration higher than said first concentration is formed in a region located directly under said first impurity region in the surface of said semiconductor substrate contacting said dielectric layer.

2. A semiconductor memory device having an SOI structure, comprising:

a dielectric layer having opposing first and second surfaces;

a semiconductor layer formed on said first surface of said dielectric layer;

a conductive layer formed on said second surface of said dielectric layer;

first and second impurity regions formed to define a channel region in said semiconductor layer; and a gate electrode formed on said channel region with an insulating layer interposed therebetween, wherein a capacitor is formed by said first impurity region, said dielectric layer opposing said first impurity region, and said conductive layer, wherein said dielectric layer includes a first dielectric portion having a first relative dielectric constant and a second dielectric portion having a second relative dielectric constant smaller than said first relative dielectric constant, and said first impurity region is located on said first dielectric portion, and said second impurity region is located on said second dielectric portion.

3. The semiconductor memory device according to claim 2, further comprising:

an interlayer insulating layer having a contact hole on said second impurity region and covering said semiconductor layer and said gate electrode; and a bit line formed on said interlayer insulating layer and in said contact hole and electrically connected to said second impurity region.

4. The semiconductor memory device having an SOI structure, including a memory cell array portion where a memory cell is formed and a peripheral circuit portion where a peripheral circuit is formed, comprising:

a dielectric layer having opposing first and second surfaces and extending from within said memory cell array portion into said peripheral circuit portion;

a semiconductor layer formed on said first surface of said dielectric layer so as to extend from within said memory cell array portion into said peripheral circuit portion;

a pair of first impurity regions formed spaced apart from each other in said semiconductor layer located within said memory cell array portion so as to define a first channel region;

a first gate electrode formed on said first channel region with a first insulating layer interposed therebetween;

a pair of second impurity regions formed spaced apart from each other in said semiconductor layer located within said peripheral circuit portion so as to define a second channel region;

a second gate electrode formed on said second channel region with a second insulating layer interposed therebetween; and a conductive layer formed on said second surface of said dielectric layer, wherein said dielectric layer is formed by a first dielectric portion having a first relative dielectric constant within said memory cell array portion, and formed by a second dielectric portion having a second relative dielectric constant smaller than said first relative dielectric constant within said peripheral circuit portion.

5. A semiconductor memory device having an SOI structure, comprising:

a first dielectric layer having opposing first and second surfaces;

a semiconductor layer formed on said first surface of said dielectric layer;

a first conductive layer formed on said second surface of said dielectric layer;

first and second impurity regions formed in said semiconductor layer so as to define a channel region;

a gate electrode formed on said channel region with an insulating layer interposed therebetween;

a second dielectric layer formed on the surface of said first impurity region; and a second conductive layer formed on said second dielectric layer, wherein a first capacitor is formed by said first impurity region said first dielectric layer opposing said first impurity region, and said first conductive layer, and a second capacitor is formed by said first impurity region, said second dielectric layer opposing said first impurity region, and said second conductive layer.

6. The semiconductor memory device according to claim 5, wherein said second dielectric layer extends onto as far as the side surface of said first impurity region.

7. A semiconductor memory device having an SOI structure, comprising:

a substrate;

a first dielectric layer formed on said substrate;

a gate electrode formed in said first dielectric layer;

a semiconductor layer formed on said first dielectric layer;

first and second impurity regions formed in said semiconductor layer with an interval so as to form a channel region at a position opposing said gate electrode;

a second dielectric layer formed on said semiconductor layer; and a conductive layer formed on said second dielectric layer, wherein a capacitor is formed by said first impurity region, said second dielectric layer opposing said first impurity region, and said conductive layer.

* * * * *